US009059364B2

(12) United States Patent
Snyder et al.

(10) Patent No.: US 9,059,364 B2

(45) Date of Patent: Jun. 16, 2015

(54) HIGH THERMOELECTRIC PERFORMANCE BY CONVERGENCE OF BANDS IN IV-VI SEMICONDUCTORS, HEAVILY DOPED PBTE, AND ALLOYS/NANOCOMPOSITES

(75) Inventors: G. Jeffrey Snyder, Pasadena, CA (US); Yanzhong Pei, Alhambra, CA (US)

(73) Assignee: California Institute of Technology, Pasadena, CA (US)

( * ) Notice: Subject to any disclaimer, the term of this patent is extended or adjusted under 35 U.S.C. 154(b) by 371 days.

(21) Appl. No.: 13/287,941

(22) Filed: Nov. 2, 2011

(65) Prior Publication Data

US 2012/0138870 A1 Jun. 7, 2012

Related U.S. Application Data

(60) Provisional application No. 61/409,481, filed on Nov. 2, 2010.

(51) Int. Cl.

*H01B 1/06* (2006.01)
*H01B 1/10* (2006.01)
*H01L 35/16* (2006.01)

(52) U.S. Cl.

CPC .................................... *H01L 35/16* (2013.01)

(58) Field of Classification Search

CPC ...................................................... H01L 35/16
USPC ................ 252/512, 513, 519.4; 136/201, 238
See application file for complete search history.

(56) References Cited

U.S. PATENT DOCUMENTS

| | | | |
|---|---|---|---|
| 3,285,019 A * | 11/1966 | Henderson et al. | 62/3.7 |
| 4,717,789 A * | 1/1988 | Rauch et al. | 136/238 |
| 2009/0178700 A1* | 7/2009 | Heremans et al. | 136/201 |

* cited by examiner

*Primary Examiner* — Khanh Tuan Nguyen
(74) *Attorney, Agent, or Firm* — Seth D. Levy; Brian T. Duke; Nixon Peabody LLP

(57) ABSTRACT

The present invention teaches an effective mechanism for enhancing thermoelectric performance through additional conductive bands. Using heavily doped p-PbTe materials as an example, a quantitative explanation is disclosed, as to why and how these additional bands affect the figure of merit. A high zT of approaching 2 at high temperatures makes these simple, likely more stable (than nanostructured materials) and Tl-free materials excellent for thermoelectric applications.

4 Claims, 10 Drawing Sheets

HIGH THERMOELECTRIC PERFORMANCE BY CONVERGENCE OF BANDS IN IV-VI SEMICONDUCTORS, HEAVILY DOPED PBTE, AND ALLOYS/NANOCOMPOSITES

CROSS-REFERENCE TO RELATED APPLICATIONS

This application claims priority from U.S. Provisional Patent Application No. 61/409,481 filed on Nov. 2, 2010, which is incorporated herein by reference in its entirety.

GOVERNMENT RIGHTS

The invention described herein was made in the performance of work under a NASA contract (NAS7-1407) and is subject to the provisions of Public Law 96-517 (35 USC202) in which the Contractor has elected to retain title.

FIELD OF THE INVENTION

The present invention relates to the use of advanced thermoelectrics for power generation.

BACKGROUND

Thermoelectric (TE) energy conversion technology, for power generation based on the Seebeck effect and refrigeration based on Peltier effect, has played an important role in powering deep space missions and cooling sensitive electronics. Without any emission or moving parts, this technology is often considered in the search for sustainable energy sources, with automotive waste heat recovery being of prime interest.

The challenge for thermoelectrics relative to other technologies is the low efficiency of the material. The maximum TE efficiency of a material is characterized by the figure of merit, $zT=S^2\sigma T/(K_E+K_L)$, where S, σ, $K_E$ and $K_L$ are the Seebeck coefficient, electrical conductivity, and the electronic and lattice components of the thermal conductivity, respectively. State-of-art commercial materials have a peak zT significantly less than unity. So far, only PbTe based materials with peak zT of less than 0.8 have been used in commercial products for power generation in the 250 C-450 C temperature range. Thus, there is a need in the art for improved thermoelectric materials.

SUMMARY OF THE INVENTION

In certain embodiments, the invention teaches a method of enhancing the thermoelectric performance of a composition, including: providing a composition; and causing different valence or conduction bands in the composition to have substantially the same energy level. In some embodiments, causing the different valence or conduction bands to have substantially the same energy level further includes tuning one or more of the Fermi level, temperature, and alloy composition of the composition. In some embodiments, the composition includes a compound selected from the group consisting of: PbTe, PbSe, PbS, GeTe, GeSe, SnTe, SnSe, SnS, CdTe, CdSe, CdS, ZnTe, ZnSe, ZnS, MnTe, MnSe, MgTe and MgSe. In certain embodiments, the composition includes a dopant selected from the group consisting of: Li, Na, K, Rb, Cs, Sb, As, Bi, Ge, Mn, Mg and Sn. In some embodiments, the composition includes rare earth (RE) chalcogenides of the formula $RE_{3-x}X_4$, wherein RE is selected from the group consisting of: Sc, Y, La, Ce, Pr, Nd, Pm, Sm, Eu, Gd, Tb, Dy, Ho, Er, Tm, Yb and Lu, and wherein X is selected from the group consisting of: S, Se, and Te. In some embodiments, RE is La and X is Te. In some embodiments, the composition includes Na doped p-type PbTe alloyed with Se. In some embodiments, 0%≤Na≤2% and 0%≤Se≤50%. In some embodiments, the composition has a maximum thermoelectric figure of merit (zT)≥1.5 at 850 K. In some embodiments, the composition includes a compound selected from the group consisting of: Pb(Mn)Te:Na, Pb(Mg)Te:Na, Pb(Cd)Te:Na, PbTe:Na/$Ag_2$Te, and PbTe(Se):Na. In some embodiments, the composition includes a compound of the formula $(Bi,Sb)_2Te_3$. In some embodiments, the composition includes a Skutterudite or filled Skutterudite. In some embodiments, the composition is of the formula $PbTe_{1-x}Se_x$.

In certain embodiments, the invention teaches a thermoelectric material including a composition having different valence or conduction bands with substantially the same energy level. In some embodiments, the thermoelectric material is produced by a process including: providing a predicate thermoelectric material including a composition having different valence or conduction bands without substantially the same energy level; and tuning one or more of the Fermi level, temperature, and alloy composition of the predicate thermoelectric material to produce the thermoelectric material including the composition having different valence or conduction bands with substantially the same energy level. In some embodiments, the composition includes a compound selected from the group consisting of: PbTe, PbSe, PbS, GeTe, GeSe, SnTe, SnSe, SnS, CdTe, CdSe, CdS, ZnTe, ZnSe, ZnS, MnTe, MnSe, MgTe and MgSe. In some embodiments, the composition includes a dopant selected from the group consisting of: Li, Na, K, Rb, Cs, Sb, As, Bi, Ge, Mn, Mg and Sn. In some embodiments, the composition includes rare earth (RE) chalcogenides of the formula: $RE_{3-x}X_4$, wherein RE is selected from the group consisting of: Sc, Y, La, Ce, Pr, Nd, Pm, Sm, Eu, Gd, Tb, Dy, Ho, Er, Tm, Yb, and Lu, and wherein X is selected from the group consisting of: S, Se, and Te. In some embodiments, RE is La and X is Te. In some embodiments, the composition includes Na doped p-type PbTe alloyed with Se. In some embodiments, 0%≤Na≤2% and 0%≤Se≤50%. In some embodiments, the composition has a maximum thermoelectric figure of merit (zT)≥1.5 at 850 K. In some embodiments, the composition includes a compound selected from the group consisting of: Pb(Mn)Te:Na, Pb(Mg)Te:Na, Pb(Cd)Te:Na, PbTe:Na/$Ag_2$Te, and PbTe(Se):Na. In some embodiments, the composition includes a compound of the formula $(Bi,Sb)_2Te_3$. In some embodiments, the composition includes a Skutterudite or filled Skutterudite. In some embodiments, the composition includes a compound of the formula $PbTe_{1-x}Se_x$.

DESCRIPTION OF THE INVENTION

Figure 1:
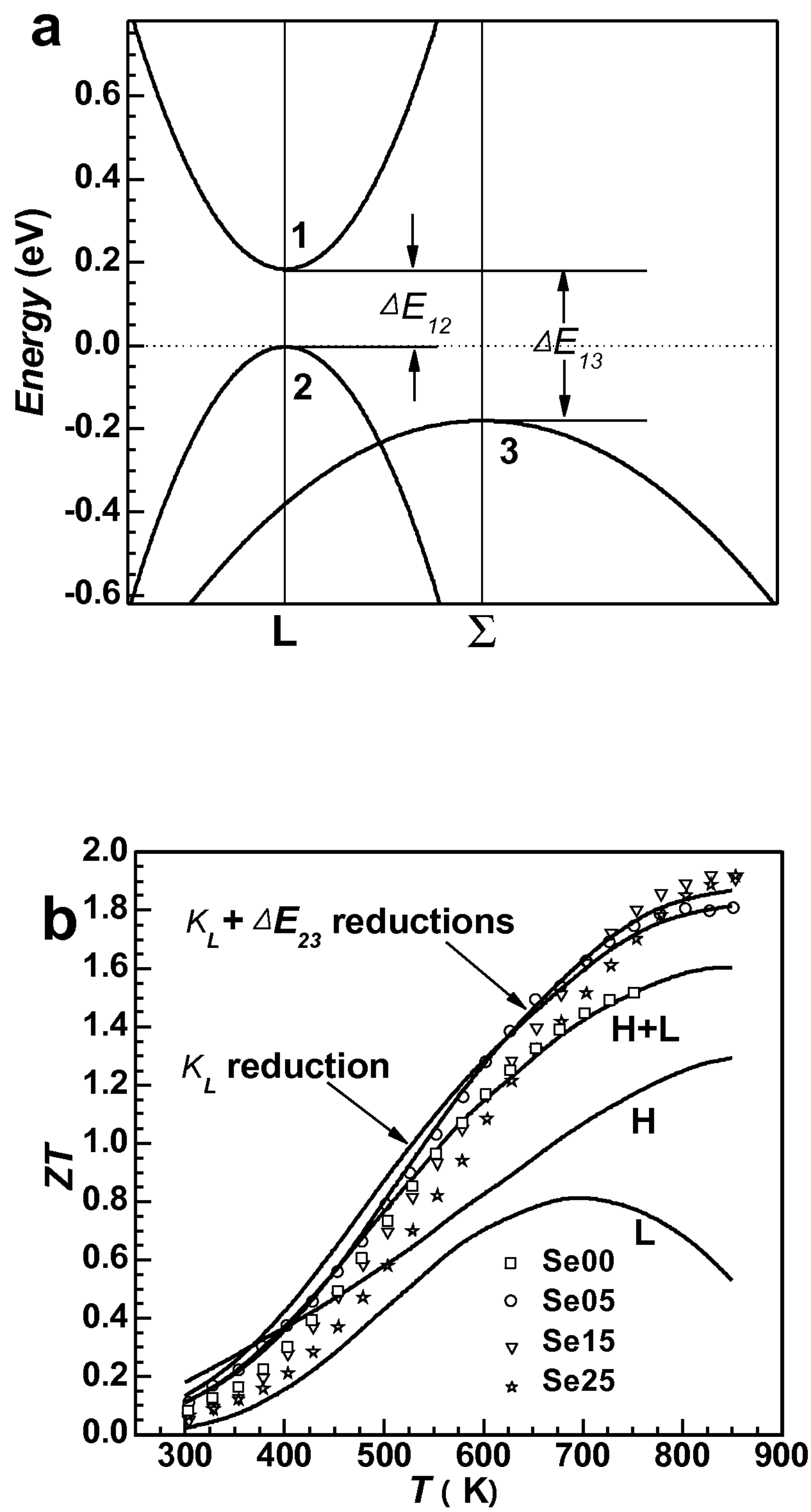
FIG. 1 demonstrates, in accordance with an embodiment of the invention, a) a band scheme for PbTe. 1-conduction band, 2-light hole band, 3-heavy hole band. At high temperatures the two valence bands align ($\Delta E_{12}\approx\Delta E_{13}$), resulting in the transport contributions from both bands 2 and 3. (b) Temperature dependent zT of p-PbTe—PbSe materials doped with 2% Na. Symbols are experimental data and curves are calculated results based on a three-band model with a total hole density of $2.5\times10^{20}$ $cm^{-3}$, with individual H and L contributions shown.

All references cited herein are incorporated by reference in their entirety as though fully set forth. Unless defined otherwise, technical and scientific terms used herein have the same meaning as commonly understood by one of ordinary skill in the art to which this invention belongs.

Low materials performance restricts the application of thermoelectric energy conversion. The inventors demonstrate herein that tuning the Fermi Level, temperature and alloy composition to bring two different valence bands of a compound to the same energy greatly enhances thermoelectric performance. Such a band alignment enables collaborative conduction by both light and heavy valence bands, resulting in a high Seebeck coefficient without a significant reduction in mobility. In this way, the thermoelectric figure of merit, zT, approaches 2 at ~850 K in heavily sodium doped p-type PbTe alloyed with selenium.

As disclosed herein, the concept of converging several nearby bands to the same energy level can be applied to many other systems. Many materials have offset valence or conduction bands that have a small effect on the transport properties. When these small offsets can be made even smaller or vanish altogether then higher thermoelectric performance results. Examples include the conduction band of $La_{3-x}Te_4$. Other rare earth chalcogenides ($RE_{3-x}X_4$), where RE is selected from Sc, Y, La, Ce, Pr, Nd, Pm, Sm, Eu, Gd, Tb, Dy, Ho, Er, Tm, Yb, and Lu, and X is selected from S, Se, and Te, will have similar band structures. As further disclosed herein, Skutterudites also have slightly offset bands that could be tuned. This strategy is even likely applicable to $(Bi,Sb)_2Te_3$ structure types as the transport shows non parabolic band characteristics that could indicate second bands nearby.

As further disclosed herein, in IV-VI compounds in particular, the bands structures are very similar and could also be engineered in the same manner as PbTe and PbSe; for example in PbS, GeTe, SnTe, SnSe, SnS, CdTe, CdSe, CdS, ZnTe, ZnSe, and ZnS. Even in these materials with distorted structures that are not NaCl type as in PbTe, they will very likely have similar band structures and therefore can be engineered to have high thermoelectric efficiency.

The present invention further teaches that it is important to engineer how the band offset changes with both temperature and composition. If the bands are not always perfectly aligned (because for example the band offset changes with temperature) then it can be important to achieve the correct doping level so that the higher degeneracy band is reached and utilized.

As further disclosed herein, p-type PbTe materials with high doping levels of Na were prepared, and the electrical properties were determined to be consistent with previously reported results. Both the experimental results and the theoretical calculations suggest that the electronic transport properties of these samples are heavily influenced by a high DOS near the Fermi level, leading to holes with heavy effective mass. These heavy mass carriers lead to a large Seebeck coefficient (compared to n-type PbTe) and high thermoelectric figure of merit of ~1.0 at ~750 K. The high zT observed is intrinsic to PbTe and is likely to contribute to the high zT observed in related p-type PbTe-based systems such as PbTe:Tl and nanostructured materials.

As also disclosed herein, the presence of many conducting valleys near the Fermi Level is a beneficial characteristic in some high zT materials. As this is a purely electronic effect, reductions in the lattice thermal conductivity, through nanostructuring for example, is likely to lead to further improvements in zT.

Unless otherwise stated, carrier density and carrier concentration are used interchangeably in the instant disclosure.

In some embodiments, the numbers expressing quantities of ingredients, properties such as molecular weight, reaction conditions, and so forth, used to describe and claim certain embodiments of the application are to be understood as being modified in some instances by the term "about." Accordingly, in some embodiments, the numerical parameters set forth in the written description and attached claims are approximations that can vary depending upon the desired properties sought to be obtained by a particular embodiment. In some embodiments, the numerical parameters should be construed in light of the number of reported significant digits and by applying ordinary rounding techniques. Notwithstanding that the numerical ranges and parameters setting forth the broad scope of some embodiments of the application are approximations, the numerical values set forth in the specific examples are reported as precisely as practicable.

In certain embodiments, the invention teaches a method of enhancing the thermoelectric performance of a composition, including: providing a composition; and causing different valence or conduction bands in the composition to have substantially the same energy level. In some embodiments, causing the different valence or conduction bands to have substantially the same energy level further includes tuning one or more of the Fermi level, temperature, and alloy composition of the composition. In some embodiments, the composition includes a compound selected from the group consisting of: PbTe, PbSe, PbS, GeTe, GeSe, SnTe, SnSe, SnS, CdTe, CdSe, CdS, ZnTe, ZnSe, ZnS, MnTe, MnSe, MgTe, MgSe and the like. One of skill in the art would readily appreciate similar materials with like properties could be substituted for those disclosed above. In some embodiments, the composition includes a dopant selected from the group consisting of: Li, Na, K, Rb, Cs, Sb, As, Bi, Ge, Mn, Mg, Sn and the like. In some embodiments, the composition includes rare earth (RE) chalcogenides of the formula $RE_{3-x}X_4$, wherein RE is selected from the group consisting of: Sc, Y, La, Ce, Pr, Nd, Pm, Sm, Eu, Gd, Tb, Dy, Ho, Er, Tm, Yb and Lu, and wherein X is selected from the group consisting of: S, Se, and Te. In some embodiments, RE is La and X is Te. In some embodiments, the composition includes Na doped p-type PbTe alloyed with Se. In some embodiments, 0%≤Na≤2% and 0%≤Se≤50%. In some embodiments, the composition has a maximum thermoelectric figure of merit (zT)≥1.5 at 850 K. In certain embodiments, the composition includes a compound selected from the group consisting of: Pb(Mn)Te:Na, Pb(Mg)Te:Na, Pb(Cd)Te:Na, PbTe:Na/$Ag_2$Te, PbTe(Se):Na, and the like. In other embodiments, the composition includes a compound of the formula $(Bi,Sb)_2Te_3$. In some embodiments, the composition includes a Skutterudite or filled Skutterudite. In certain embodiments, the composition is of the formula $PbTe_{1-x}Se_x$.

In certain embodiments, the invention teaches a thermoelectric material including a composition having different valence or conduction bands with substantially the same energy level. In some embodiments, the thermoelectric material is produced by a process including: providing a predicate thermoelectric material including a composition having different valence or conduction bands without substantially the same energy level; and tuning one or more of the Fermi level, temperature, and alloy composition of the predicate thermoelectric material to produce the thermoelectric material including the composition having different valence or conduction bands with substantially the same energy level. In some embodiments, the composition includes a compound selected from the group consisting of: PbTe, PbSe, PbS, GeTe, GeSe, SnTe, SnSe, SnS, CdTe, CdSe, CdS, ZnTe, ZnSe, ZnS, MnTe, MnSe, MgTe, MgSe and the like. One of skill in the art would readily appreciate similar materials with like properties could be substituted for those disclosed above. In some embodiments, the composition includes a dopant selected from the group consisting of: Li, Na, K, Rb, Cs, Sb, As, Bi, Ge, Mn, Mg, Sn and the like. In some embodiments, the composition includes rare earth (RE) chalcogenides of the formula $RE_{3-x}X_4$, wherein RE is selected from the group consisting of: Sc, Y, La, Ce, Pr, Nd, Pm, Sm, Eu, Gd, Tb, Dy, Ho, Er, Tm, Yb and Lu, and wherein X is selected from the group consisting of: S, Se, and Te. In some embodiments, RE is La and X is Te. In some embodiments, the composition includes Na doped p-type PbTe alloyed with Se. In some embodiments, 0%≤Na≤2% and 0%≤Se≤50%. In some embodiments, the composition has a maximum thermoelectric figure of merit (zT)≥1.5 at 850 K. In some embodiments, the composition includes a compound selected from the group consisting of: Pb(Mn)Te:Na, Pb(Mg)Te:Na, Pb(Cd)Te:Na, PbTe:Na/$Ag_2$Te, PbTe(Se):Na, and the like. In certain embodiments, the composition includes a compound of the formula $(Bi,Sb)_2Te_3$. In some embodiments, the composition includes a Skutterudite or filled Skutterudite. In certain embodiments, the composition includes a compound of the formula $PbTe_{1-x}Se_x$. In certain embodiments of the present invention, nanostructuring is used to further enhance the thermoelectric performance of the materials disclosed.

In some embodiments, the invention teaches a thermoelectric material including a compound of the formula $Na_xPb_{1-x}Te$. In certain embodiments, 0.5%≤x≤2%. In some embodiments, the composition has a maximum thermoelectric figure of merit (zT) of greater than 1.0 at 750 K. In some embodiments, nanostructuring is used to further increase zT.

In certain embodiments, the invention teaches a method of manufacturing a compound of the present invention, wherein 98% or higher dense samples described herein are obtained by a metallurgical route, including: melting, quenching, annealing and hot pressing.

In some embodiments, the invention discloses a method of manufacturing a compound, including: providing a quantity of Na; providing a quantity of Pb; providing a quantity of Te; loading the elements into containers; and melting the elements, followed by quenching, annealing and hot pressing. In some embodiments, the compound is of a formula including $Na_xPb_{1-x}Te$, wherein 0.5%≤x≤2.0%. In some embodiments, the composition has a maximum thermoelectric figure of merit (zT) of greater than 1.0 at 750 K. One of skill in the art would readily appreciate that other elements with similar characteristics could be substituted for those disclosed herein.

In some embodiments of the invention, compounds are manufactured by melting, annealing and hot-pressing. Stoichiometric mixtures of high purity Na (99%), Pb (99.999%) and Te (99.9999%) ingots are sealed in graphite coated ampoules under vacuum and heated to 1,273 K at ~500 K/hour. After soaking at 1,273 K for about 6 hours, the ampoules are cold-water quenched and annealed at 973 K for 48 hours. The resulting ingots are pulverized and hot pressed at 700 K for 1 hour. In some embodiments, the compound is of a formula including $Na_xPb_{1-x}Te$, wherein 0.5%≤x≤2.0%. In some embodiments, the composition has a maximum thermoelectric figure of merit (zT) of greater than 1.0 at 750 K. One of skill in the art would readily appreciate that other elements with similar characteristics could be substituted for those disclosed herein. One of skill in the art would likewise appreciate that alternative methods of making the compounds could be used. For example, the compounds could be heated at a temperature ranging from 600 to 1500 K for between 0.5 and 24 hours. Similarly, the annealing can be performed at a temperature ranging from 600 to 1200 K for between 1 and 120 hours. Finally, hot pressing can be alternatively performed at a temperature ranging from 700 to 1000 K for between 10 and 120 minutes.

In certain embodiments of the invention, one or more thermoelectric materials disclosed herein are used in a thermoelectric device. In some embodiments, a temperature gradient is applied to the thermoelectric device and electrical energy is collected. In some embodiments, electrical energy is applied to the thermoelectric material and heat is transferred from a first space at a first operation temperature to a second space at a second operation temperature, wherein the first operation temperature is lower than the second operation temperature.

Merely by way of example, thermoelectric modules including those made of materials disclosed herein are used to harness waste heat from automotive exhaust (500 K-800 K) to produce electricity and reduce $CO_2$ emissions.

One skilled in the art will recognize many methods and materials similar or equivalent to those described herein, which could be used in the practice of the present invention. Indeed, the present invention is in no way limited to the methods and materials described.

EXAMPLES

Example I

Experiments I

Convergence of Bands for the Enhancement of Thermoelectric Performance

Recent efforts have focused on nano-structuring PbTe to reduce $K_L$, thus enhancing the zT (3, 4) with much evidence that zT>1 has now been obtained. Such materials have $K_L$ close to the amorphous limit, so that further efforts focusing on the enhancement of the electronic part ($S^2\sigma$) are likely to have greater potential. Seebeck coefficient enhancements through density state modification are promising but these also risk reduction in carrier mobility.

The electronic performance depends mainly on the effective mass (m*) and the mobility (μ) of carriers, via the weighted mobility, $m^{*3/2}\mu$, which is one of the best criteria for searching for good TE semiconductors (6, 7). However, the mobility is low for bands with heavy mass. In fact, for charge carriers predominantly scattered by acoustic phonons (as has been found in most of the known, good TE materials) it is expected that $\mu \propto 1/m^{*5/2}$ (8). Thus, the net effect of increasing the band mass should be detrimental.

Alternatively, increasing the number of charge carrying bands has virtually no detrimental effects. In the common terminology where m* is the equivalent single parabolic band mass, multiple degenerate bands (bands with same band mass $m_b^*$ and located at the same energy) have the effect of increasing m* without explicitly reducing μ. If $N_v$ is the number of degenerate bands (or "valleys" in the Fermi surface) then the effective SPB mass is enhanced by $N_v^{2/3}$: $m^*=N_v^{2/3}m_b^*$. The mobility is nominally the same but may be reduced by intervalley scattering.

It is clear then that a large band degeneracy is good for TE materials. High band degeneracy can occur in high symmetry structures (such as PbTe) if the Fermi surface forms isolated pockets at low symmetry points. Skutterudites have extremely high mobility but the conduction and valence band Fermi surfaces form around the Γ point where $N_v$~1. The widely used thermoelectric material $(Bi,Sb)_2Te_3$ has significant band degeneracy with $N_v$=6. The valence band maximum in PbTe occurs at the L point where the degeneracy is 8, and in addition there is a second valence band with energy about 0.2 eV below along the Σ line that has a degeneracy of 12.

By engineering the convergence of bands to occur at the desired temperature, enhanced thermoelectric performance results. As disclosed herein, the inventors demonstrate this effect in PbTe where the L and Σ valence bands can be aligned to give increased band degeneracy of 20. Combining this effect in the low lattice thermal conductivity PbTe—PbSe alloys the inventors achieved a zT near 2 at 850K.

In a system that contains two valence (or conduction) bands (See FIG. 1*a* for an example), the total conductivity ($\sigma_{total}$) and Seebeck coefficient ($S_{total}$) can be expressed as $$\sigma_{total}=\sigma_2+\sigma_3, \quad (1)$$

$$S_{total}=(\sigma_2 S_2+\sigma_3 S_3)/\sigma_{total} \quad (2)$$

respectively. Here, the subscripts 2 and 3 refer to the transport properties of carriers in the individual bands. If two bands are present then the total Seebeck coefficient is a weighted average of the Seebeck coefficient of the individual bands, where the band with the higher conductivity is weighted the strongest. Because Seebeck usually decreases with the number of carriers n, but conductivity increases (σ=neμ) the total Seebeck will generally be closer to the smaller of the two. Only when the two band energies are aligned, such that the two bands have the same Seebeck, will the Seebeck not be reduced but the total conductivity will be substantially higher than either band alone.

Numerous studies (10-15) show the existence of a secondary (heavy Σ) valence band slightly (~0.2 eV) below the principal (light L) valence band in PbTe and this is confirmed by recent density function theory calculations (16, 17). A schematic band structure (18) of PbTe is shown in FIG. 1*a*. With this two valence band model, the electrical transport, optical spectroscopy and other properties of p-PbTe can be well understood. Most importantly, the light hole band moves below the heavy band at T>~450 K, with a temperature dependent energy offset of (10):

$$\Delta E_{23}(\text{eV})=0.18-4*T/10000+0.04x_{Se}$$

$$\Delta E_{13}(\text{eV})=0.36+0.1x_{Se} \quad (3)$$

This means, in the temperature range of interest (300-850 K), the offset, $\Delta E_{23}$, between the sub-bands is within ~2 $k_BT$ making them effectively aligned in this temperature range, and therefore enabling increased TE performance as proposed above. The energy difference between bands 1 and 3 was found to be ~0.36 eV which gives a temperature dependent band gap until the L and Σ bands cross (at 450 K for PbTe).

Na is an effective donor in PbTe to obtain hole density up to $10^{20}$ $cm^{-3}$ by replacing nominally divalent Pb with monovalent Na. The valence band at the L point with $N_v$=8 has sufficient mobility to enable a good zT of about 0.8 (curve "L" in FIG. 1 is the contribution from light band from the model described below) consistent with early reports on p-type PbTe lightly doped with Na (19). The peak in zT is due to the onset of minority carriers from the conduction band—so a two band model (Conduction +L) is needed to correctly model the transport behavior. The second valence band along Σ with $N_v$=12 would have even higher performance at the same (heavy band curve "H" or Σ in FIG. 1) according to the inventors' modeling.

Figure 2:
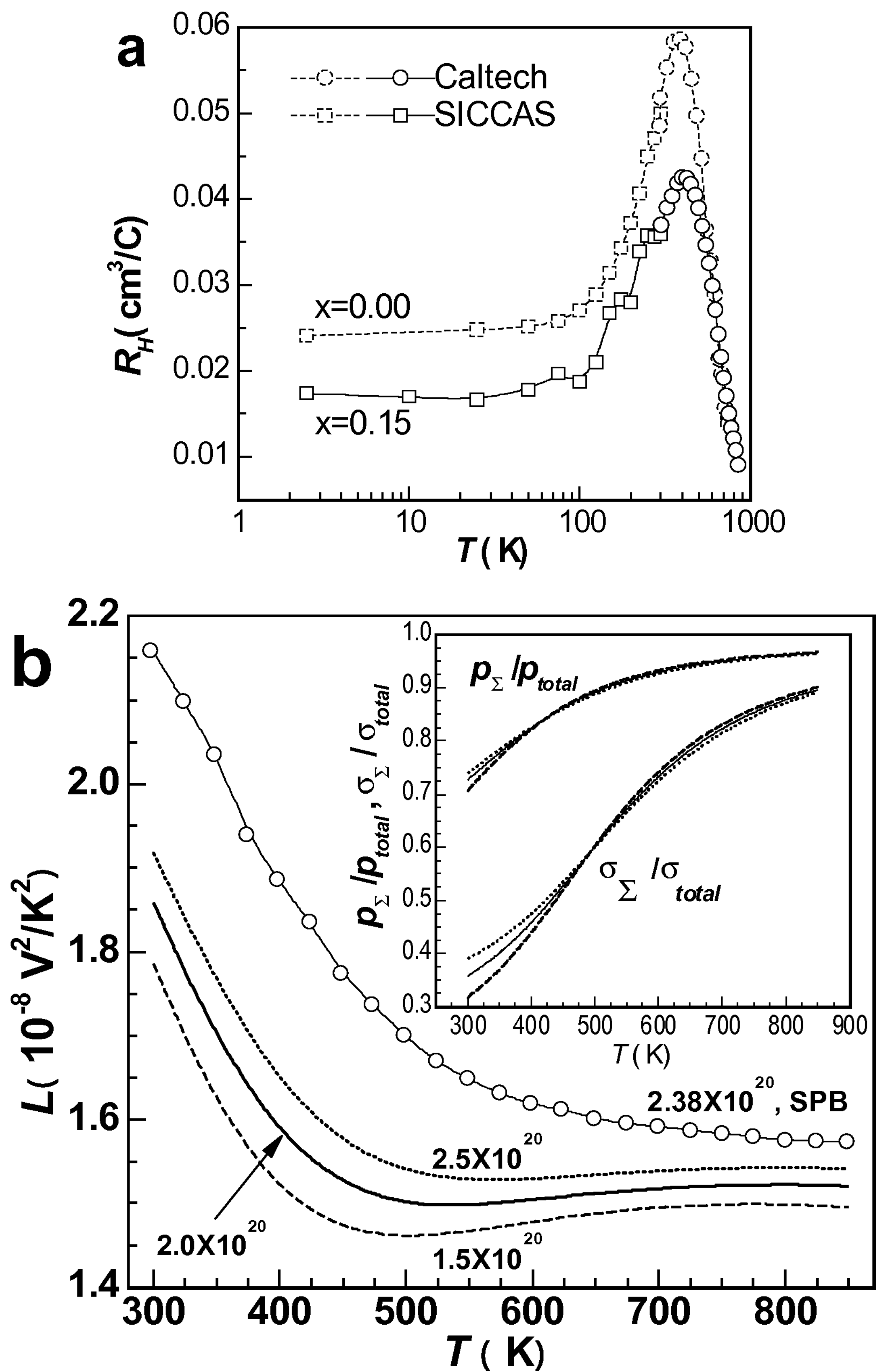
FIG. 2 demonstrates, in accordance with an embodiment of the invention, temperature dependent Hall coefficient (a), Lorenz number (b) calculated based on the 3-band model. The fractional contribution of heavy hole band to the conductivity and carrier density (inset of b) indicates the light hole band additionally contributes to the charge transport.

A distinct feature of the two valence bands is clearly seen from the peak in the Hall coefficient ($R_H$) at ~450 K (10, 13, 14, 20, 21) (FIG. 2). The increase in $R_H$ below 450 K and the sharp decrease afterwards is due to the redistribution of holes between the subbands (2 and 3 in FIG. 1*a*). The lower mobility heavy band (band 3) contributes more at higher temperatures.

When both the L and Σ bands align, as demonstrated in $PbTe_{1-x}Se_x$, when x~0.2 and T~600 K, there is added contribution to the thermoelectric effects and a higher zT results. As disclosed herein, even in PbTe without Se a zT~1.4 at 800K results when the doping is sufficiently high to reach both the L and Σ bands.

Alloying PbTe with PbSe reduces the band misalignment and has the added benefit of providing lower lattice thermal conductivity due to point defect scattering of phonons. When these contributions are included the predicted zT at 900K is 1.8-1.9 ($K_L+\Delta E_{23}$ reduction in FIG. 1), and is very close to the inventors' experimental values.

To confirm that the multi-band effects are indeed responsible for the extraordinary thermoelectric properties, a detailed non-parabolic 3-band model has been developed. It is important to include the temperature dependence of the band gap, band offset and effective masses to fit the data accurately. Luckily, these parameters were determined by optical absorption spectroscopy and other temperature dependent transport properties for a wide range of carrier densities (10, 14, 22, 23). Bands 1 and 2 were found to be strongly non-parabolic and have been described by the Kane model (10, 24, 25), while heavy hole band 3 has been described as parabolic (10, 15). The model also assumes that acoustic phonons dominate the electron scattering at 300-850 K, which is justified by the strong decrease in mobility with temperature. As disclosed herein, the electronic model also gives the Lorenz factor and bipolar thermal conduction term needed to calculate the electronic contribution to the thermal conductivity.

The lattice thermal conductivity is significantly reduced by alloying with PbSe consistent with previous studies (26). This $K_L$-reduction in PbTe is expected, phonons are scattered due to the mass difference and local strain caused by the impurity atoms. The thermal conductivity reduction is well characterized by the Debye-Callaway model (27-29). Using the electronic model and the lattice thermal conductivity ($K_L$), the thermoelectric figure of merit, zT, can be calculated at any doping level, alloy composition and temperature.

Figure 3:
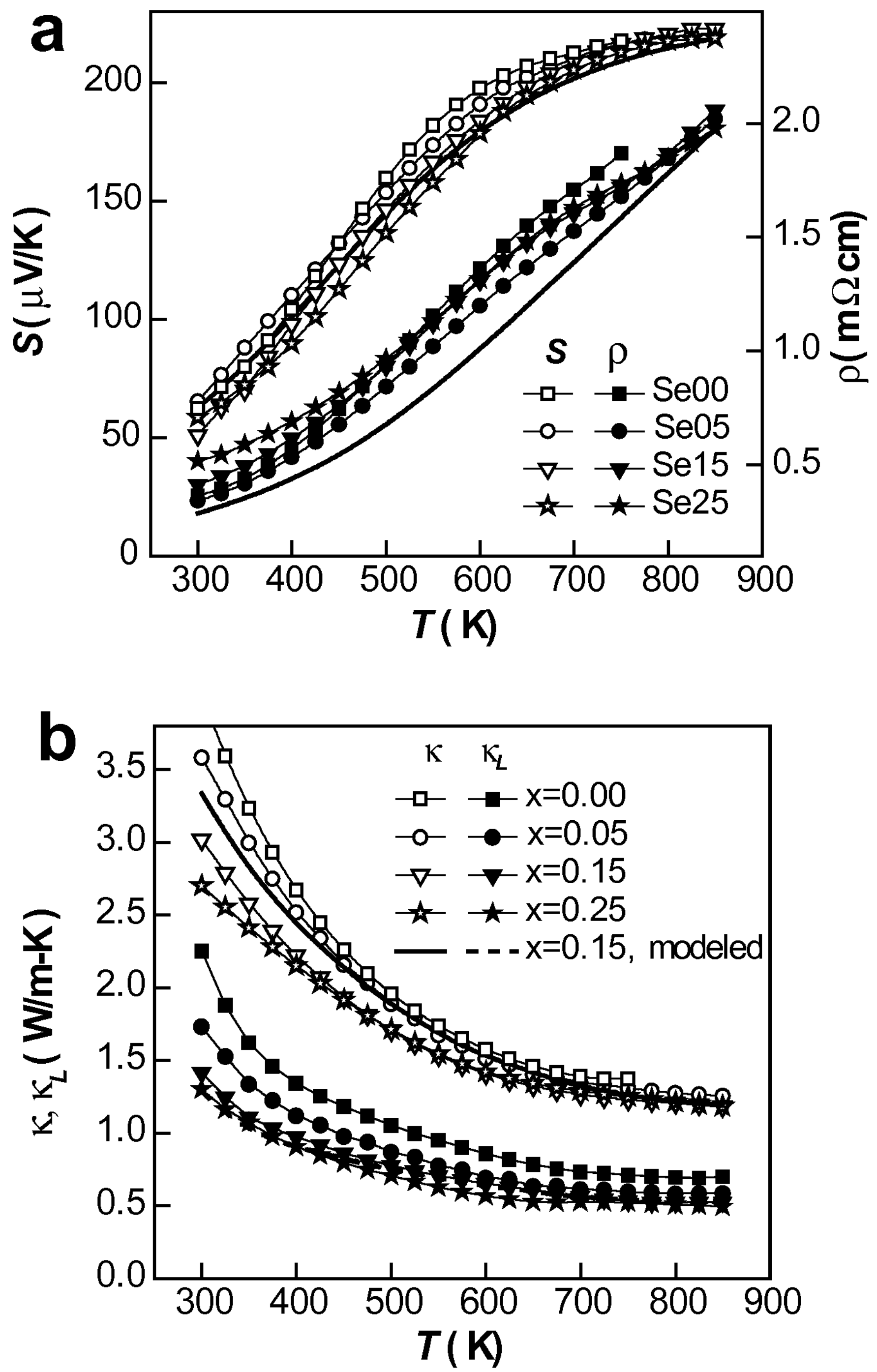
FIGS. 3*a* and 3*b* demonstrate, in accordance with an embodiment of the invention, temperature dependence of the Seebeck coefficient, resistivity, thermal conductivity and its lattice component and zT for PbTe—PbSe alloy doped with 2% Na. The 3 band modeled results for total hole concentration of $2.5\times10^{20}$ $cm^{-3}$ using a lattice thermal conductivity of PbTe:Na are shown.

The measurements of temperature dependent Seebeck coefficient, resistivity ($\rho=1/\sigma$) and thermal conductivity are shown in FIG. 3. The measured temperature dependent transport properties agree very well with the electronic model confirming that the exceptional thermoelectric properties arise when the L and Σ bands converge (within a few kT). Even the zT measured on (several) 2% Na-doped PbTeSe15% of 1.9+/−0.2 at 850 K (from multiple samples on multiple instruments) shows good agreement with the calculated zT.

In summary, an effective mechanism for enhancing the thermoelectric performance through additional conductive band(s) is disclosed. Choosing heavily doped p-PbTe materials as an example, the inventors quantitatively explain why and how these additional bands affect the figure of merit. As disclosed herein, this purely electronic effect for zT enhancement can be combined with other mechanisms such as alloy scattering. High zT of approaching 2 at high temperatures make these simple, likely more stable (than nanostructured materials) and Tl-free materials excellent for thermoelectric energy applications.

Example 2

Experimental Procedures

98% or higher dense samples used for this study were obtained with a metallurgical route including melting, quenching, annealing and hot-pressing. The details on transport properties measurements can be found elsewhere. X-ray diffraction and scanning electron microscope analysis confirm that the materials for this study were single phased. Scanning Seebeck coefficient measurements (at 300K) on one of the samples with zT of ~1.8 at 800 K showed a Seebeck coefficient variation of only 5 μV/K (full width for 90% of the data taken in an area of 6.5×7 mm$^2$). All samples used for the study were doped with 2% Na and the room temperature Hall carrier density increased with increasing Se content as the inventors' expected. They were 1.27, 1.47, 1.56 and 1.65×10$^{20}$ cm$^{-3}$ for 0%, 5%, 15% and 25% Se alloys, respectively. It should be noted these hole densities may be only a half to one third of the doping density as further disclosed herein.

$K_L$ is estimated using the Debye-Callaway model (27-29) with parameters taken from the study of La doped $Ag_2Te$—PbTe assuming an alloy scattering model for 15% Se. Effective single band (no degeneracy) masses of 0.3 $m_e$, (24) 0.36 $m_e$ (12) and 2$m_e$ (15, 21, 30, 31) for bands 1, 2 and 3 at room temperature, respectively. The m* depends on temperature via Δ=dlnm*/dlnT=0.5 (24, 32) for bands 1 and 2 while m* is independent with temperature for band 3 (10, 15).

The inventors estimate $\Delta E_{23}$ to be reduced by 0.02 eV for 15% Se alloy and calculated zT vs. T for this alloy. A slight increase in zT at high temperatures can be found, due to the increased contribution by the light band because of this $\Delta E_{23}$-reduction. While not wishing to be bound by any one particular theory, it should be noted that $\Delta E_{23}$ probably decreases while $\Delta E_{13}$ roughly remains the same with PbTe when Se content increases (10, 22, 33, 34).

With the knowledge of ξ, b and the effective masses, the light to heavy band deformation potential (8) ratio can be estimated to be about 37%, associating with the measured resistivity at this temperature. The deformation potential for the heavy band is ~4.5 eV and 12 eV for the light band. With similar band parameters, the deformation potential for the conduction band of ~12 eV, according to the inventors' previous study on n-PbTe (35), is estimated and used for the following discussion. The much smaller deformation potential for the heavy hole band as compared with that of the light hole band, is presumably due to the factor that the band maxima of the heavy hole band locates at different point in k-space (18, 25).

With the known energy offsets between the sub-bands, effective mass, deformation potential for each band and their temperature dependencies as determined above, one can calculate the transport properties at any given Fermi level and temperature. The details on multi-band modeling taking the band parabolicity into account can be found in textbooks (10, 36, 37). Firstly, as shown in the inset of FIG. 2*b*, with a total hole concentration of 1.5~2.5×10$^{20}$ cm$^{-3}$, both the carrier density and conductivity fractions, of the heavy hole to the total, are found to be higher than 50% at T>~400 K. This means, in a wide temperature range, thermoelectric p-PbTe materials are dominated by the heavy hole band, thus the inventors call the light hole band an additional band for charge conduction.

To assess the thermal conductivity for these materials, the following equations for the estimation of total Lorenz number (L) and $K_L$ were used:

$$L = \sum_{i=1}^{3} L_i\sigma_i \Big/ \sum_{i=1}^{3}\sigma_i,\ \kappa_L = \kappa - LT\sum_{i=1}^{3}\sigma_i \quad (5)$$

where $L_i$ and $\sigma_i$ are the Lorenz number and conductivity for each subband shown in FIG. 1*a*. The temperature dependent L for p=1.5, 2.0 and 2.5×10$^{20}$ cm$^{-3}$, along with the comparison to the calculated values usually assuming a single parabolic band ($L_{SPB}$), is shown in FIG. 2*b*. As can be seen, a ~20% reduction of L compared with $L_{SPB}$ at low temperatures indicates the strong nonparabolic behavior and the large fractional contribution of the light hole band (38, 39). With increasing temperature, the redistribution of carrier results in a increasing contribution of the parabolic heavy hole band, and thus L gradually converges with $L_{SPB}$ at high temperatures. Because the samples used for this study have a carrier density around 2.5×10$^{20}$ cm$^{-3}$, the L values calculated for this carrier density are used for the following determinations for the electronic and thus lattice component of the total thermal conductivity.

The low T Hall data enables the inventors to effectively determine the doping concentration (p). Below 50 K $R_H$ remains constant, as expected for a single parabolic band, because most of the carriers belong to band 2 (i.e. $f_2 \rightarrow 1$ in eq 4).

In a two-band system, $R_H$ can be expressed as:

$$R_H = 1/ne^* [A_2 b^2 f_2 + A_3(1-f_2)]/[(b-1)f_{2+1}]^2 \quad (4)$$

where n, e, $A_2$ and $A_3$, b and $f_2$ are the total hole concentration, electron charge, Hall factors for band 2 and 3, mobility ratio of band 2 to 3 and the fraction of holes belonging to band 2. To estimate the band parameters more accurately, the Hall factors ($A=A_K A_\tau$) allow the isotropy effect ($A_K$) for bands 1 and 2 in this study, which is chosen to be a constant of 0.9 (32). The inventors take $A_K=1$ for band 3 because this parameter has not yet been determined. The mobility ratio, b, which results in a maximum of $R_H$, can be graphically solved form Eq. 4 and the Hall factors for these sub-bands.

Analyzing the data from the 2% Na-doped sample at 400 K one can estimate the reduced Fermi energy ($\xi$) to be $\xi_2=2\pm0.5$ for band 2 and $\xi_3=1.5\pm0.5$ for band 3. In this range of reduced Fermi level, Hall factors of band 2 ($A_{2=1.5}$) and band 3 ($A_3=1.1$) do not vary by more than 2%. Thus a light to heavy hole mobility ratio, b, of ~5 at 400 K is obtained, according to the measured $R_H$ data at both 2.5 K and 400 K.

Example 3

Further Band Engineering

The concept of converging several nearby bands to the same energy level can be applied to many other systems. Many materials have offset valence or conduction bands that have a small effect on the transport properties. If these small offsets can be made even smaller, or vanish altogether, then higher thermoelectric performance will result. Examples include the conduction band of $La_{3-x}Te_4$. Other rare earth chalcogenides ($RE_{3-x}X_4$), where RE is selected from Sc, Y, La, Ce, Pr, Nd, Pm, Sm, Eu, Gd, Tb, Dy, Ho, Er, Tm, Yb, and Lu, and X is selected from S, Se, and Te will have similar band structure. Skutterudites also have slightly offset bands that could be tuned. It may even be applicable to $(Bi,Sb)_2Te_3$ structure types as the transport shows non parabolic band characteristics that could indicate second bands nearby.

In IV-VI compounds in particular, the bands structures are very similar and could also be engineered in the same manner as PbTe and PbSe; for example in PbS, GeTe, SnTe, SnSe, SnS, CdTe, CdSe, CdS, ZnTe, ZnSe, ZnS. Even in these materials with distorted structures that are not NaCl type as in PbTe, they will very likely have similar band structures and therefore can be engineered to have high thermoelectric efficiency.

It is important to engineer how the band offset changes with both temperature and composition. If the bands are not always perfectly aligned (because for example the band offset changes with temperature) then it may be important to achieve the correct doping level so that the higher degeneracy band is reached and utilized.

Figure 4:
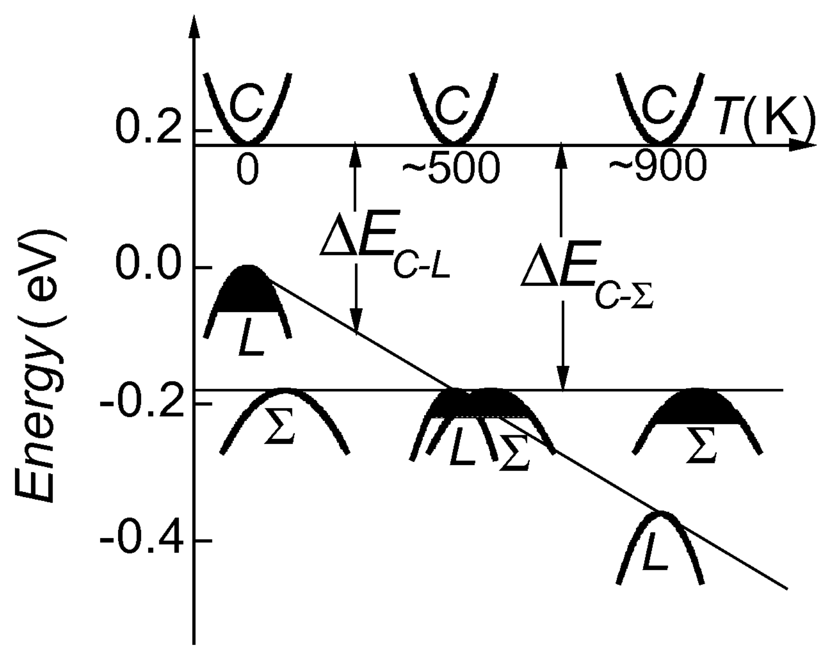
FIG. 4 demonstrates, in accordance with an embodiment of the invention, shift of the band edges of PbTe with temperature; a) $dE_g/dT=-d\Delta E/dT=4\times10^{-4}$ eV/deg at 0° K; b) $\Delta E\approx0$ at 450° K; c) $E_g=0.36$ eV, $dE_g/dT\approx0$ at 1000° K.
Figure 5:
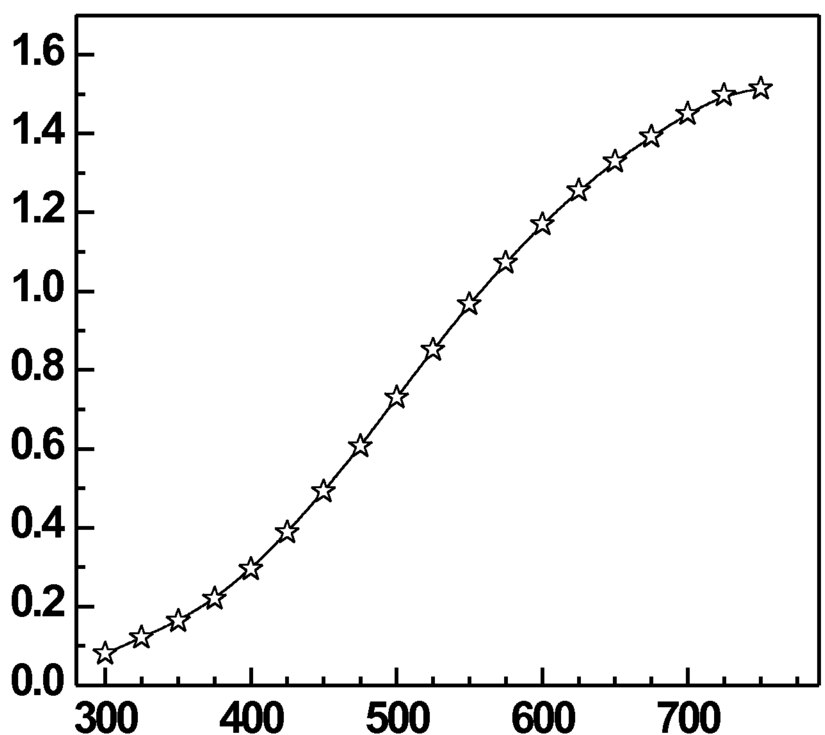
FIG. 5 demonstrates, in accordance with an embodiment of the invention, ZT vs T for PbTe:Na.

As shown in FIG. 4, the band structure of PbTe and its temperature dependence have been suggested by optical absorption, Hall effect, Seebeck coefficient, Nernst-Ettingshausen effect, resistivity, thermal conductivity, photoconductivity and reflectance measurements. With this feature of band structure, a band-convergence effect for the enhancement of thermoelectric power factor can be expected, because in the temperature range of interest of 300-850K the energy offset between light and heavy hole is within ~$2k_BT$ ($k_B$ is the Boltzmann constant), which is a critical energy window for the transport properties. This effect can be well demonstrated by heavily Na-doped PbTe. With a room temperature Hall carrier density of $1\times10^{20}$ cm$^{-3}$, the maximum ZT reaches as high as ~1.5 at ~750 K as shown in FIG. 5.

Figure 6:
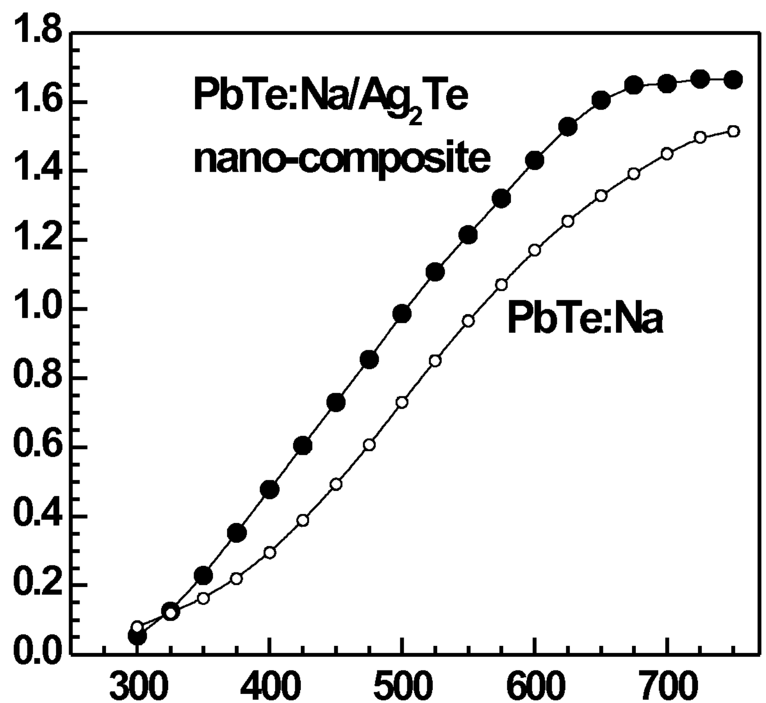
FIG. 6 demonstrates, in accordance with an embodiment of the invention, ZT vs T for PbTe:Na/$Ag_2Te$ nano-composite.
Figure 7:
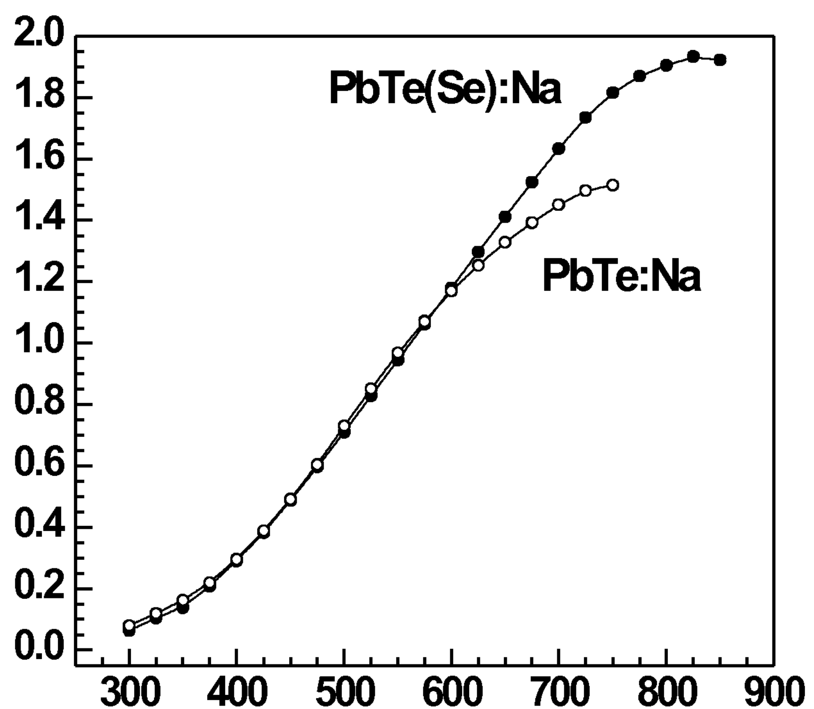
FIG. 7 demonstrates, in accordance with an embodiment of the invention, ZT vs T for PbTe—PbSe alloy with Na-doping.

As indicated above, this is a purely electronic effect and can be combined with other mechanisms, such as lattice thermal conductivity reduction via nano-structures or alloy scattering, as demonstrated by FIGS. 6 and 7.

Furthermore, with the reported modifications in the band structure by some other substitutions, such as Ge, Mn and Mg, the band gaps between conduction band and light or heavy bands (or both) will be changed. Examples are as follows:

TABLE I

The dependence of the direct energy gap and lattice constant on alloy fraction x for various II-IV-VI and IV-VI alloys at 300 K.

| Alloy | Lattice Constant Å | Direct Energy Gap (eV) |
|---|---|---|
| $Cd_xPb_{1-x}Te$ | 6.459 − 0.30x (x ≤ 0.10) (Rosenberg et al 1964) | 0.295 + 2.2x (x ≤ 0.035) |
| $Mg_xPb_{1-x}Te$ | 6.459 − 0.39x (x ≤ 0.06) (Crocker and Sealy 1972) | 0.295 + 2.4x (x ≤ 0.07) |
| $Cd_xPb_{1-x}Se$ | 6.127 − 0.42x (x ≤ 0.25) (Wald and Rosenberg 1965) | 0.265 + 2.4x (x ≤ 0.10)) |
| $Mg_xPb_{1-x}Se$ | 6.127 − 0.31x (x ≤ 0.05) (Crocker and Sealy 1972) | 0.265 + 2.4x (x ≤ 0.05) |
| $Sn_xPb_{1-x}Te$ | 6.459 − 0.13x (x ≤ 1.0) (Bis and Dixon 1969) | 0.30 − 0.48x (x ≤ 1.0) (Dimmock et al 1966) |
| $(GeSe)_x(PbTe)_{1-x}$ | 6.459 − 0.75x (x ≤ 0.3) (Nikolic 1965) | 0.30 + 0.40x (x ≤ 0.2) (Nikolic 1965) |

L. Rogers and A. Crocker, Journal of physics. D, Applied physics 5 1671 (1972).

TABLE II

| Sample No. | Composition | Type of Carrier | Carrier Density × $10^{-17}$ cm$^{-3}$ | Thickness, μ | $E_{gd}$, eV |
|---|---|---|---|---|---|
| 1 | $Pb_{0.95}Mn_{0.05}Te$ | n | 3.49 | 8.6 | 0.375 |
| 2 | $Pb_{0.95}Mn_{0.05}Te$ | p | 21.8 | 8.2 | 0.375 |
| 3 | $Pb_{0.90}Mn_{0.10}Te$ | p | 6.5 | 6.7 | 0.490 |

I. A. Drabkin, Zakharyu. G f, and I. V. Nelson, Sov Phys Semicond 5 277 (1971).

Figure 8:
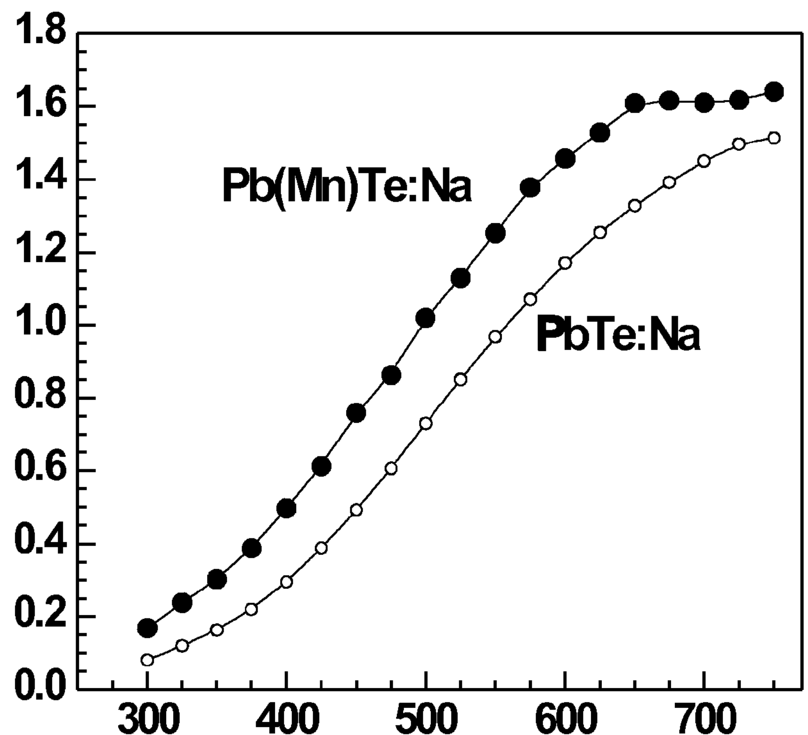
FIG. 8 demonstrates, in accordance with an embodiment of the invention, ZT vs T for Pb(Mn)Te:Na.
Figure 9:
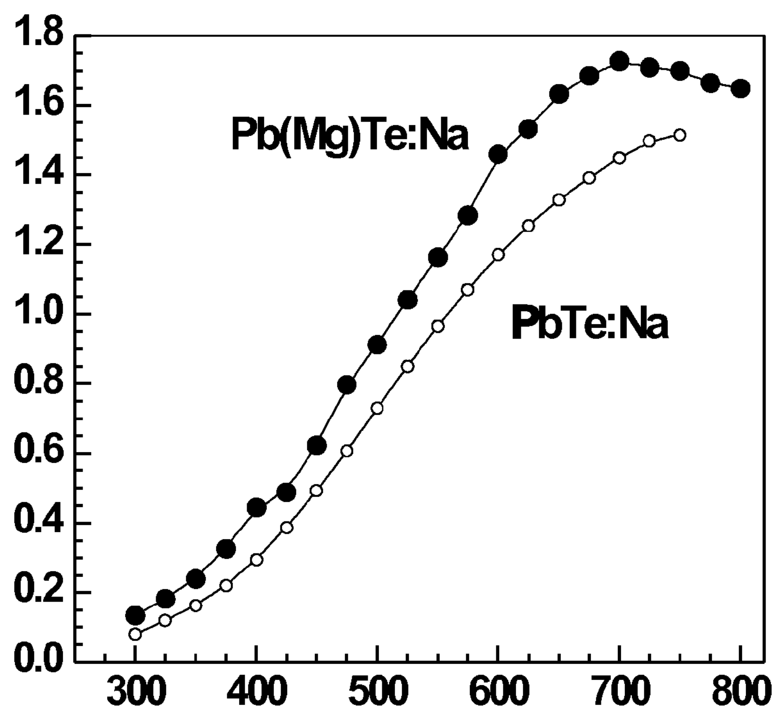
FIG. 9 demonstrates, in accordance with an embodiment of the invention, ZT vs T for Pb(Mg)Te:Na.

As a result, the band convergence effect can be tuned for different desired temperature uses. With the decreased energy gap between the two valence sub-bands by other substitution, maximum ZT can be expected at a relatively lower temperature range. Taking Mn and Mg for examples, the obtained ZT are shown in FIGS. 8 and 9.

Example 4

Experiments II

High Thermoelectric Figure of Merit in Heavy-Hole Dominated PbTe

On 16-17 Jan. 1959 the headlines in Washington D.C. USA newspapers heralded the “world’s first atomic battery” with a picture of President Eisenhower examining a Radioisotope Thermoelectric Generator (RTG) as it sat on his desk in the Oval Office of the White House[1, 2]. This 5 watt generator converted radioisotope heat to electricity using the Seebeck effect of Thermoelectric (TE) semiconductors made from n- and p-type PbTe. PbTe can be made p-type by replacing some divalent Pb with monovalent Na.[3] Doping of Na made the "2P—PbTe" used in this 1959 generator and for several NASA missions in the 1960's[1].

The thermoelectric properties of PbTe were extensively studied in both the USA (lead by the 3M corporation) and the Soviet Union for military and space applications in the 1950's and early 1960's[5-7]. As previously disclosed herein, the performance of a TE material is characterized by the TE figure of merit, $zT=S^2T/\rho(\kappa_E+\kappa_L)$, where S, ρ, $\kappa_E$ and $\kappa_L$ are the Seebeck coefficient, resistivity, and the electronic and lattice components of the thermal conductivity, respectively. At that time the Seebeck coefficient and resistivity could be measured accurately but thermal conductivity at high temperature was notoriously difficult to measure[8].

Not surprisingly then the 1960 report of Fritts, from 3M, does not use actual thermal conductivity data when showing a maximum zT of ~0.7. Instead, the room temperature lattice thermal conductivity was assumed at high temperatures[5, 6, 9] which underestimates zT. This relatively low maximum zT is similar with that for the "3P—PbTe"[10] used later by Teledyne for NASA[4]. The data of Fritts with the same maximum zT was therefore assumed to be accurate for PbTe:Na[5, 9, 11-13].

Not until the advent of the flash diffusivity technique, developed in the USA in the early 1960's, were high temperature thermal conductivity measurements of semiconductors reliable[8]. However, by then, The USA had switched from studying PbTe to Si—Ge alloys[14] due to the capability for higher temperature use. The Soviet groups leading efforts to understand the physics of PbTe[7] were not using the flash diffusivity method and report few high temperature measurements of κ[15-19]. It is perhaps not surprising then that until now, there has been no well documented report on the high temperature thermal conductivity of heavily doped PbTe:Na to show the maximum zT is actually ~1.5.

As previously disclosed herein, thermoelectrics are attracting renewed interest because of their ability to harvest electricity from waste heat[20]. Because the parameters S, ρ and $\kappa_E$ are interdependent by the carrier concentration (n)[9, 21], the independent parameter, lattice thermal conductivity, can be reduced to increase zT. One proven route to minimize $\kappa_L$ and enhance zT to 1.4~1.7 at ~700 K in PbTe materials[22-24] has been the incorporation of nano-inclusions that act as phonon scattering centers.

Using a different mechanism, zT as high as ~1.5 has been achieved in p-type Tl-doped PbTe with hole concentrations close to $5\times10^{19}$ $cm^{-3}$. The high zT is attributed to the Tl-doping introducing a strong enhancement of the density-of-states (DOS) due to a resonant state near the Fermi level that results in a significant enhancement of the Seebeck coefficient[25]. The most direct evidence for the presence of the resonant state is the room temperature Seebeck coefficient of PbTe:Tl being significantly larger than that of normal PbTe materials with the same doping level (FIG. 10(*a*)).

However, a similar behavior of enhanced DOS around the Fermi level in heavily doped p-type PbTe without resonant states, has been found or proposed in both theoretical and experimental studies, due to either an additional band[7, 26, 27] or a complex Fermi surface[28] slightly below (~0.2 eV) the valence band edge. Therefore, the transport properties of PbTe at high doping levels (without resonant states) will be dominated by heavy mass holes, particularly at high temperatures due to the broadening of Fermi distribution. In the recent calculation by Singh[28], this DOS enhancement is enough to explain the high Seebeck coefficient of PbTe:Tl without including resonant states.

Experimentally, Na will dope PbTe with hole concentrations ranging from $\sim10^{18}$ to $\sim10^{20}$ $cm^{-3}$[7, 29-32] and does not introduce resonant states[26, 33]. The S of PbTe:Na decreases with hole concentration according to the Pisarenko relation expected for a single parabolic band at low hole concentrations[29]. The dependence of S on n at high carrier concentrations shows a deviation[7, 29-32] from the trend expected from the Pisarenko relationship, leading to an increased Seebeck coefficient (FIG. 10(*a*)).

Here the inventors confirm the previous results on S, ρ, n for heavily doped PbTe:Na and measure the high temperature thermal conductivity, resulting in a zT reaching ~1.5 in heavily doped samples at ~750 K. The inventors demonstrate herein, both the heavy hole character in PbTe:Na as well as the enhanced S in PbTe:Tl due to resonant states.

Polycrystalline $Na_xPb_{1-x}Te$ (0.5%<x<2%) samples were synthesized by melting, annealing and hot-pressing. Stoichiometric mixtures of high purity Na(99%), Pb(99.999%) and Te(99.9999%) ingots were sealed in graphite coated ampoules under vacuum and heated to 1273 K at ~500 K/hour. After soaking at 1273 K for about 6 hours, the ampoules were cold-water quenched and annealed at 973 K for 48 hours. The resulting ingots were pulverized and hot pressed at 700 K for 1 hour. Pellets with a relative density of 98% or higher were used for measurements of transport properties. The Seebeck coefficient was obtained from the slope of the thermopower vs. temperature gradients using Chromel-Nb thermocouples. The resistivity and Hall coefficient ($R_H$) were simultaneously measured using the Van der Pauw technique under a reversible magnetic field of 2T. Thermal diffusivity was measured by the laser flash method (Netzsch LFA 457). All of the measurements were carried out under vacuum in the temperature range of 300-750 K. Consistent measurements, within ~10% for Seebeck and Resistivity were confirmed at JPL (using W-Nb thermocouples) and ULVAC-ZEM3 at ZTPlus on a sample with zT ~1.4 at 700K. Scanning Seebeck coefficient measurements (at 300K) on the sample with Hall carrier density of $9\times10^{19}$ $cm^{-3}$ showed a Seebeck coefficient variation of only 5 μV/K (full width for 90% of the data). The Dulong-Petit heat capacity ($C_p$=0.15 J/g-K, close to the experimental results from 150 to 270 K[34]) was used for the estimation of thermal conductivity. The combined uncertainty for the determination of zT is ~20%.

Figure 10:
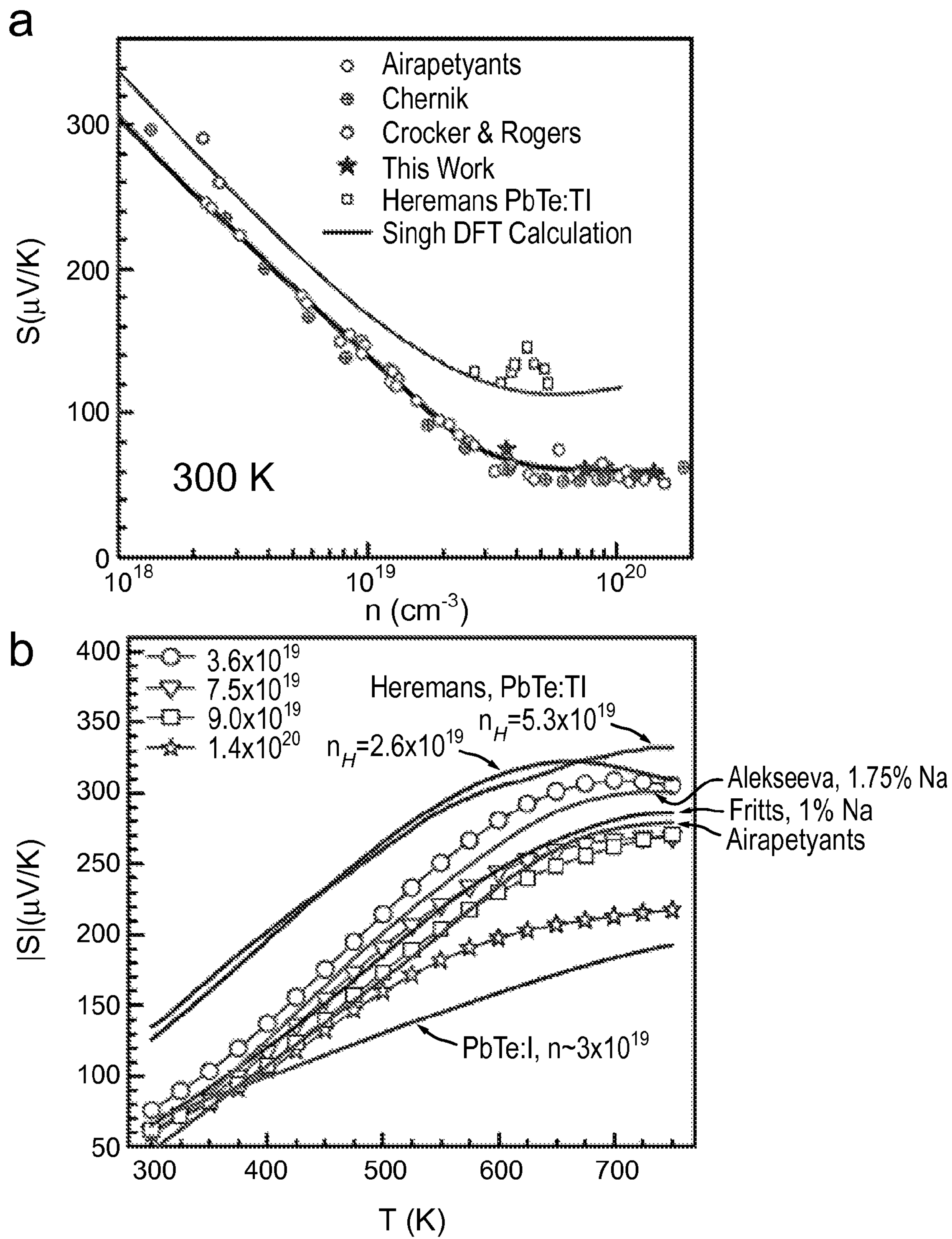
FIG. 10 demonstrates, in accordance with an embodiment of the invention, (a) room temperature Seebeck coefficient versus carrier concentration for p-type PbTe doped with Na[19, 29-31] and Tl[25]. The solid black line is the relationship shown by Airapetyants[29] (b) Temperature dependent Seebeck coefficient for both p-[6, 19, 25, 29] and n-type[6] materials with high carrier concentrations.

X-ray diffraction and scanning electron microscope analysis was used to confirm that the materials for this study were single phased. The obtained samples have room temperature Hall carrier densities ($n_H$) of 3.5, 7.5, 9.0 and $14\times10^{19}$ $cm^{-3}$, estimated by $n_H=1/eR_H$. FIG. 10(*a*) shows the Hall carrier density dependent Seebeck coefficient at room temperature.

The samples made for this study are consistent with the previous studies on PbTe:Na single crystals[29, 30] showing the same in S vs. n behavior at room temperature (FIG. 10(*a*)), including the deviation which results in a flattening of the curve at S~60 μV/K.

It has been asserted that this deviation in Seebeck coefficient, as well as other electronic transport property behavior, could be explained by a two-band model (light and heavy bands).[7, 29-32, 35-37] much like that found the $La_{3-x}Te_4$ system[38]. At low hole concentrations the light band dominates the Seebeck coefficient and other transport properties, while at high hole concentrations the heavy band contribution enhances the Seebeck coefficient beyond the value predicted by the Pisarenko relationship for the light band[7, 29]. The band offset (difference in energy between the band maxima of light and heavy bands) has been reported to be temperature dependent, such that the light band goes below the heavy band at approximately 400 K[7, 39]. A modeling study, based on multi-parabolic bands and the above described band structure features, predicted an optimized zT as high as ~1.7 in heavily doped (~$10^{20}$ $cm^{-3}$) p-PbTe at ~750K, which is about twice of that in n-PbTe[35], due to the heavy mass carriers behavior.

FIG. 10*a* also shows the Seebeck coefficient predicted from DFT calculations[28] of p-PbTe (blue solid line). The calculation shows a similar flattening due to a complex Fermi surface, where the Seebeck coefficient becomes approximately constant at S~120 μV/K when the carrier density is greater than ~$4\times10^{19}$ $cm^{-3}$. The difference between the calculated and experimental Seebeck coefficient may originate from the uncertainties of band structure and/or the associated temperature dependence. It should also be noted that the experimental carrier density is Hall density ($n_H$), while the DFT carrier density is a doping density, n. It is believed that $n_H$ is much smaller than n when the mobility ratio of heavy holes to light holes is small[7, 40]. In one report, spectroscopic analysis suggested an actual hole density (n) of ~$15\times10^{19}$ $cm^{-3}$ while Hall measurement showed a hole density ($n_H$) of only ~$9\times10^{19}$ $cm^{-3}$[29].

The analysis using two-band model and both DFT calculations[27, 28] discussed above, indicate the presence of enhance DOS closed to valence band edge, which predicts the flatting of S (FIG. 10*a*). Thus the observed flattening of the Seebeck coefficient can be explained by either the complex Fermi surface found by Singh, or an offset heavy band model.

In contrast, n-type PbTe[26, 28] lacks a DOS enhancement around the Fermi level and shows a more typical Seebeck coefficient proportional to absolute temperature. With increasing temperature, the pronounced enhancement of the Seebeck coefficient in p-type materials indicates an increasing number of heavy mass holes contribute to the transport properties, due to a broader Fermi distribution at high temperatures. Below 400K, p- and n-type PbTe have similar S due to similar effective masses[7] ($0.36m_e$ for light hole and $0.3m_e$ for electron). However, a significant discrepancy starts at ~400 K with p-type material showing an atypical increase in slope of S vs. T resulting in a larger Seebeck coefficient at temperatures higher than 400K. This observation is consistent with the two band model in which the band offset between light and heavy bands becomes smaller with temperature and vanishing at ~400 K[7, 39, 41].

The PbTe:Tl[25] system shows an even higher S than the various PbTe:Na samples, indicating that there is an enhancement effect present due to the resonant states. Although it is concluded that the resonant states by Tl-doping are responsible for the enhancement of the Seebeck coefficient[25] at room temperature, the heavy mass behavior is likely to be additionally contributing to the Seebeck coefficient in PbTe:Tl at higher temperatures.

Figure 11:
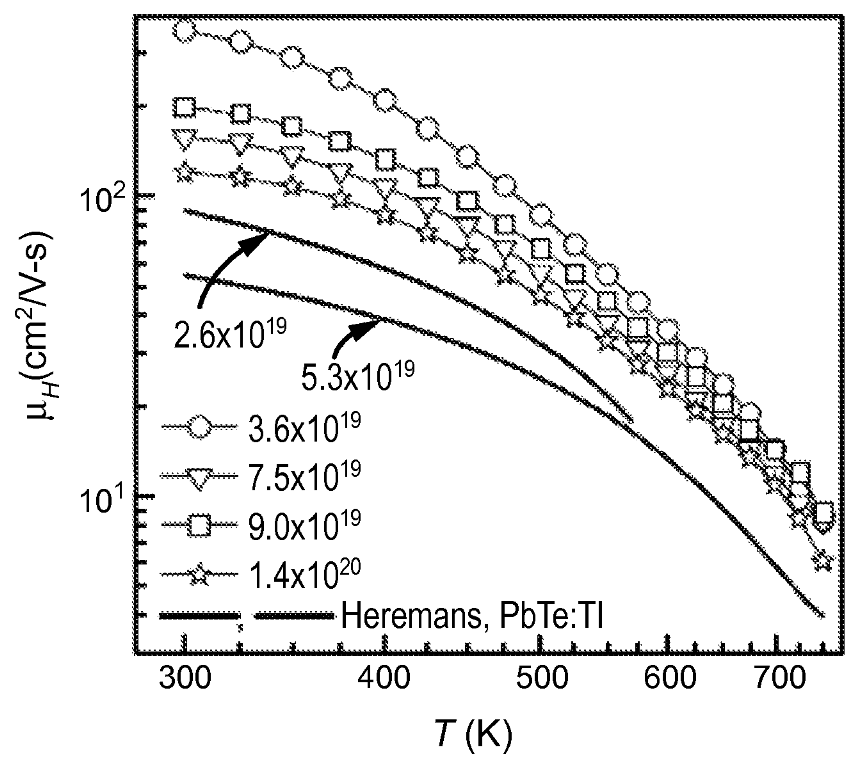
FIG. 11 demonstrates, in accordance with an embodiment of the invention, Hall mobility versus temperature for PbTe:Na and the comparison with that of PbTeiTl[25].

Additionally, the carrier mobility in PbTe:Tl has been found to be decreased by a significant factor[25]. Both PbTe:Tl and PbTe:Na have a similar temperature dependence of Hall mobility as shown in FIG. 11, however the mobility of PbTe:Na are approximately twice that of PbTe:Tl over the whole temperature range. The resonant impurity states in the Tl-doped material should lead to a reduced group velocity and therefore reduce carrier mobility.

Figure 12:
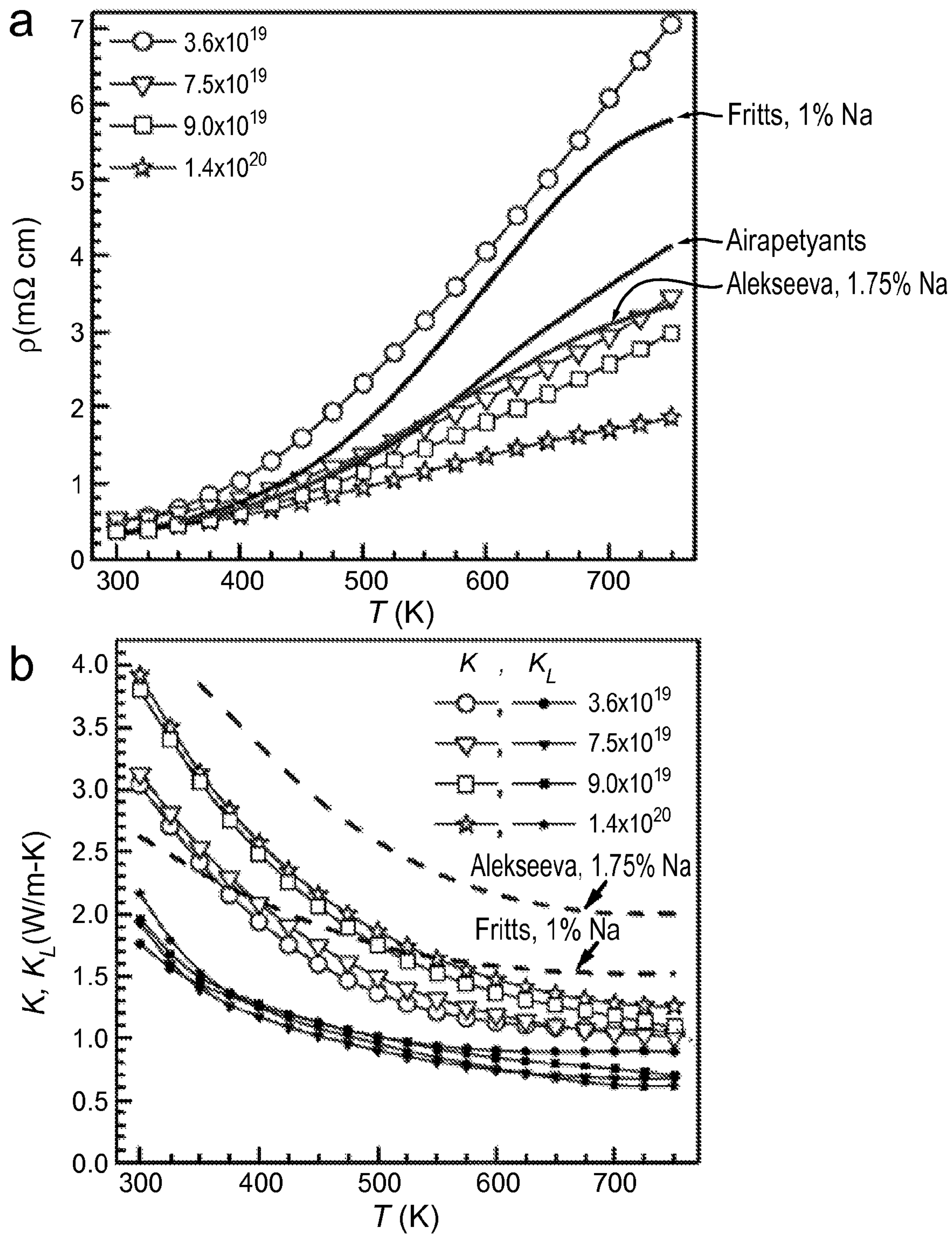
FIG. 12 demonstrates, in accordance with an embodiment of the invention, temperature dependent electrical resistivity (a), thermal conductivity and the lattice component of thermal conductivity (b) for PbTe:Na. Data plotted as lines are from the literature[6, 19, 29].

The total thermal conductivity (κ)[42] of the PbTe:Na samples are shown in FIG. 12*b* as open symbols. Since Na acts as an effective acceptor, the increased hole concentration (FIG. 10*a*) results in a decreased resistivity as shown in FIG. 12*a*. As a result of the decreased resistivity, the electronic contribution to the thermal conductivity, as determined by Wiedemann-Franz Law ($\kappa_E$=LT/ρ), is increased resulting in larger total thermal conductivity as shown in FIG. 12*b*.

Due to the complexity and the non-parabolicity of the valence band structure around the Fermi level, accurate determination of the Lorenz number (L) is difficult. An estimation of L can be made using a single parabolic band (SPB) model with acoustic scattering[43] resulting in an L with a deviation of less than 10%[23] as compared with a more rigorous non-parabolic band model calculation[44]. The estimation of the lattice thermal conductivity (FIG. 12*b*, solid symbols) is made by subtracting the electronic component from the total thermal conductivity, $\kappa_L=\kappa-\kappa_L$. The estimated lattice thermal conductivity for both PbTe:Na and PbTe:Tl is approximately 2 W/m-K at room temperature and ~0.7 W/m-K at ~750 K, these values are also consistent with n-type PbTe materials, within the uncertainty range of L-estimation[7, 45]. The slightly higher $\kappa_L$ for the lowest carrier density sample at T>~550 K is probably due to the bipolar contribution. In the previously reported study of Fritts[6], the temperature independent lattice thermal conductivity of ~1.5 W/m-K and non-degenerate L was used and resulted in an overestimation of the total thermal conductivity for 1% Na-doped PbTe at high temperatures, shown in FIG. 12*b* as a dashed black line.

Figure 13:
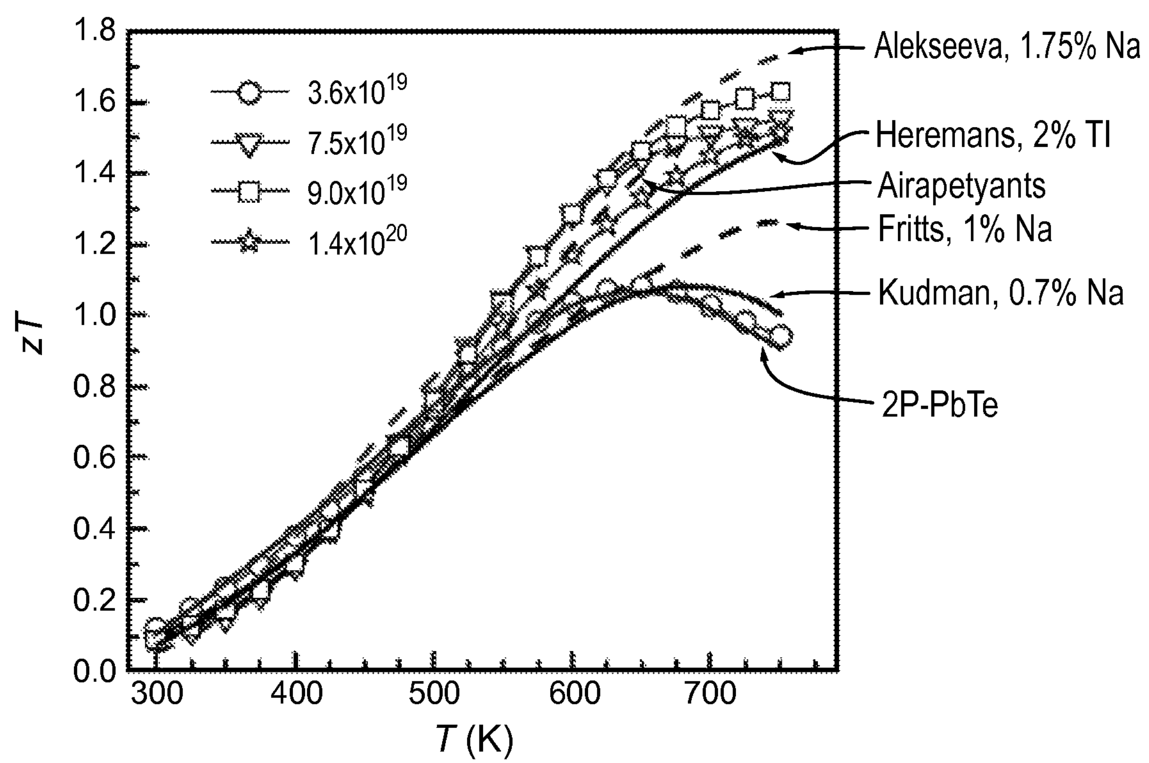
FIG. 13 demonstrates, in accordance with an embodiment of the invention, temperature dependent thermoelectric figure of merit for PbTe:Na, measured in this work (symbols), reported in the literature[46, 47] (solid lines) and that estimated from electronic transport data in the literature (dashed lines)[6, 19, 29], as well as PbTeiTl[25]. The reported 2P—PbTe is consistent with the under doped PbTe:Na.

Using the estimated lattice thermal conductivity for PbTe:Na, the figure of merit for 1% Na-doped PbTe reported by Fritts was recalculated (FIG. 13). The resulting maximum zT of ~1.3 is nearly twice the original value that used the room temperature lattice thermal conductivity for high temperatures[5, 6, 9]. Using the same estimate for temperature dependent lattice thermal conductivity in combination with previously reported[19, 29] S and ρ for heavily doped PbTe:Na, reveals an even higher zT.

Not only the zT of 2P—PbTe reported by Skrabeck[46] but also of the 0.7% Na-doped PbTe reported by Kudman,[4] are in excellent agreement with the sample here (0.5% Na-doping) with $n_H$ of $3.6\times10^{19}$ $cm^{-3}$, suggesting the 2P—PbTe and 0.7% Na-doped sample[47] are slightly under doped. An increase in hole density by increasing doping content of Na to 1~2%, results in a further enhancement of zT to ~1.5, primarily due to the suppression of minority carrier activation at high temperature.

Due to the heavy hole dominated transport properties at high doping levels and high temperatures, these PbTe:Na materials with high Na content show comparable zT with the resonant PbTe:Tl[25] system—despite the further enhancement of S due to the Tl-resonant states (FIG. 10). The increased Seebeck coefficient by resonant states at the expense of carrier mobility appears to be responsible for the similar zT. Samples with $n_H$>~$7.5\times10^{19}$ $cm^{-3}$, have been made reproducibly in the inventors' experiments showing zT>1.4 at ~750K, making PbTe:Na a promising and Tl-free material for high performance thermoelectric power generation applications.

In summary, p-type PbTe materials with high doping levels of Na were prepared and the electrical properties are consistent with previously reported results. Both the experimental results and the theoretical calculations suggest that the electronic transport properties of these samples are heavily influenced by a high DOS near the Fermi level leading to holes with heavy effective mass. These heavy mass carriers lead to a large Seebeck coefficient (compared to n-type PbTe) and high thermoelectric figure of merit of ~1.5 at ~750 K. The high zT observed is intrinsic to PbTe and may contribute to the high zT observed in related p-type PbTe-based systems such as PbTe:Tl[25] and nanostructured materials[22].

The presence of many conducting valleys near the Fermi Level is a beneficial characteristic in some high zT materials.

As this is a purely electronic effect, reductions in the lattice thermal conductivity, through nanostructuring for example, should lead to further improvements in zT.

The various methods and techniques described above provide a number of ways to carry out the application. Of course, it is to be understood that not necessarily all objectives or advantages described can be achieved in accordance with any particular embodiment described herein. Thus, for example, those skilled in the art will recognize that the methods can be performed in a manner that achieves or optimizes one advantage or group of advantages as taught herein without necessarily achieving other objectives or advantages as taught or suggested herein. A variety of alternatives are mentioned herein. It is to be understood that some preferred embodiments specifically include one, another, or several features, while others specifically exclude one, another, or several features, while still others mitigate a particular feature by inclusion of one, another, or several advantageous features.

Furthermore, the skilled artisan will recognize the applicability of various features from different embodiments. Similarly, the various elements, features and steps discussed above, as well as other known equivalents for each such element, feature or step, can be employed in various combinations by one of ordinary skill in this art to perform methods in accordance with the principles described herein. Among the various elements, features, and steps some will be specifically included and others specifically excluded in diverse embodiments.

Although the application has been disclosed in the context of certain embodiments and examples, it will be understood by those skilled in the art that the embodiments of the application extend beyond the specifically disclosed embodiments to other alternative embodiments and/or uses and modifications and equivalents thereof.

In some embodiments, the terms “a” and “an” and “the” and similar references used in the context of describing a particular embodiment of the application (especially in the context of certain of the following claims) can be construed to cover both the singular and the plural. The recitation of ranges of values herein is merely intended to serve as a shorthand method of referring individually to each separate value falling within the range. Unless otherwise indicated herein, each individual value is incorporated into the specification as if it were individually recited herein. All methods described herein can be performed in any suitable order unless otherwise indicated herein or otherwise clearly contradicted by context. The use of any and all examples, or exemplary language (for example, “such as”) provided with respect to certain embodiments herein is intended merely to better illuminate the application and does not pose a limitation on the scope of the application otherwise claimed. No language in the specification should be construed as indicating any non-claimed element essential to the practice of the application.

Preferred embodiments of this application are described herein, including the best mode known to the inventors for carrying out the application. Variations on those preferred embodiments will become apparent to those of ordinary skill in the art upon reading the foregoing description. It is contemplated that skilled artisans can employ such variations as appropriate, and the application can be practiced otherwise than specifically described herein. Accordingly, many embodiments of this application include all modifications and equivalents of the subject matter recited in the claims appended hereto as permitted by applicable law. Moreover, any combination of the above-described elements in all possible variations thereof is encompassed by the application unless otherwise indicated herein or otherwise clearly contradicted by context.

All patents, patent applications, publications of patent applications, and other material, such as articles, books, specifications, publications, documents, things, and/or the like, referenced herein are hereby incorporated herein by this reference in their entirety for all purposes, excepting any prosecution file history associated with same, any of same that is inconsistent with or in conflict with the present document, or any of same that may have a limiting affect as to the broadest scope of the claims now or later associated with the present document. By way of example, should there be any inconsistency or conflict between the description, definition, and/or the use of a term associated with any of the incorporated material and that associated with the present document, the description, definition, and/or the use of the term in the present document shall prevail.

In closing, it is to be understood that the embodiments of the application disclosed herein are illustrative of the principles of the embodiments of the application. Other modifications that can be employed can be within the scope of the application. Thus, by way of example, but not of limitation, alternative configurations of the embodiments of the application can be utilized in accordance with the teachings herein. Accordingly, embodiments of the present application are not limited to that precisely as shown and described.

REFERENCES

Experiments I

1. L. E. Bell, *Science* 321, 1457 (2008).
2. G. J. Snyder, in *Thermoelectrics handbook: macro to nano*, D. M. Rowe, Ed. (CRC/Taylor & Francis, Boca Raton, 2006), pp. 1-26.
3. K. F. Hsu et al, *Science* 303, 818 (February, 2004).
4. B. Poudel et al, *Science* 320, 634 (May, 2008).
5. J. Heremans et al, *Science* 321, 554 (2008).
6. H. J. Goldsmid, *Thermoelectric refrigeration*. The International cryogenics monograph series (Plenum Press, New York, 1964), pp. x, 240 p.
7. R. R. Heikes, R. W. Ure, *Thermoelectricity: science and engineering*. (Interscience Publishers, New York, 1961), pp. xi, 576 p.
8. J. Bardeen, W. Shockley, *Phys Rev* 80, 72 (1950).
9. H. J. Goldsmid, *Introduction to Thermoelectricity*. (Springer, Heidelberg, 2009).
10. Y. I. Ravich, B. A. Efimova, I. A. Smirnov, *Semiconducting lead chalcogenides*. Monographs in semiconductor physics v. 5 (Plenum Press, New York, 1970), pp. xv, 377 p.
11. R. S. Allgaier, *J Appl Phys* 32, 2185 (1961).
12. S. V. Airapetyants, M. N. Vinograd, I. N. Dubrovsk, N. V. Kolomoet, I. M. Rudnik, *Soviet Physics Solid State, Ussr* 8, 1069 (1966).
13. A. A. Andreev, V. N. Radionov, *Sov Phys Semicond+* 1, 145 (1967).
14. I. A. Chernik, V. I. Kaidanov, Vinograd. Mi, Kolomoet. Nv, *Sov Phys Semicond+* 2, 645 (1968).
15. A. J. Crocker, L. M. Rogers, *J Phys—Paris* 29, C4 (1968).
16. D. Bile et al, *Phys Rev Lett* 93, 146403 (2004).
17. K. Hoang, S. D. Mahanti, M. G. Kanatzidis, *Phys Rev B* 81, 115106 (2010).
18. G. Nimtz, B. Schlicht, *Springer Tracts in Modern Physics* 98, 1 (1983).

19. R. W. Fritts, in *Thermoelectric materials and devices*., I. B. Cadoff, E. Miller, Eds. (Reinhold Pub. Corp., New York, 1960), pp. 143-162.
20. R. S. Allgaier, B. B. Houston, *J Appl Phys* 37, 302 (1966).
21. A. J. Crocker, L. M. Rogers, *Brit J Appl Phys* 18, 563 (1967).
22. Devyatko. Ed, V. A. Saakyan, *Soviet Physics Solid State, Ussr* 10, 1239 (1968).
23. V. A. Saakyan, Devyatko. Ed, I. A. Smirnov, *Soviet Physics Solid State, Ussr* 7, 2541 (1966).
24. T. S. Stavitskaya, I. V. Prokofev, Y. I. Ravich, B. A. Efimova, *Sov Phys Semicond+* 1, 952 (1968).
25. Y. I. Ravich, B. A. Efimova, V. I. Tamarche, *Physica Status Solidi B—Basic Research* 43, 11 (1971).
26. G. T. Alekseev, B. Efimova, L. M. Ostrovsk, O. S. Serebrya, M. Tsypin, *Soviet physics. Semiconductors* 4, 1122 (1971).
27. P. G. Klemens, *P Phys Soc Lond A* 68, 1113 (1955).
28. J. Callaway, H. C. Vonbaeyer, *Phys Rev* 120, 1149 (1960).
29. B. Abeles, *Phys Rev* 131, 1906 (1963).
30. L. M. Sysoeva, M. N. Vinograd, N. V. Kolomoet, Y. I. Ravich, *Sov Phys Semicond+* 3, 975 (1970).
31. L. M. Rogers, *Brit J Appl Phys* 18, 1227 (1967).
32. H. A. Lyden, *Physical Review a—General Physics* 134, 1106 (1964).
33. A. J. Strauss, *T Metall Soc Aime* 242, 354 (1968).
34. B. Sealy, A. Crocker, *J Mater Sci* 8, 1737 (1973).
35. Y. Pei, A. F. May, C. J. Snyder, To be published.
36. C. M. Bhandari, D. M. Rowe, in *CRC handbook of thermoelectrics*, D. M. Rowe, Ed. (CRC Press, Boca Raton, Fla., 1995), pp. 45.
37. E. H. Putley, *J Phys C Solid State* 8, 1837 (1975).
38. I. A. Smirnov, Y. I. Ravich, *Sov Phys Semicond+* 1, 739 (1967).
39. C. M. Bhandari, D. M. Rowe, *J Phys D Appl Phys* 18, 873 (1985).

REFERENCES

Experiments II

[1] *Atomic Power in Space, a History.* US DoE March 1987, http://www.fas.org/nuke/space/index.html
[2] E. Gamarekian, *First Atom Battery Developed by U.S.* Washington Post 17 Jan. 1959 page A1,
[3] E. S. Toberer, A. F. May and G. J. Snyder, *Chem. Mater.,* 22, 624, (2010).
[4] R. D. Abelson, In *Thermoelectrics handbook: macro to nano*, Ed. by Rowe D M; CRC/Taylor & Francis: Boca Raton, 2006; p 566-567
[5] R. R. Heikes, R. C. Miller and R. W. Ure, In *Thermoelectricity: science and engineering*, Ed. by Heikes R R and Ure R W; Interscience Publishers: New York, 1961; p 407~413
[6] R. W. Fritts, In *Thermoelectric Materials and Devices*, Ed. By Cadoff I B and Miller E; Reinhold Publishing Corporation: New York: Reinhold, 1960; p 143-162
[7] Y. I. Ravich, B. A. Efimova and I. A. Smirnov, *Semiconducting Lead Chalcogenides*. Plenum, New York, 1970.
[8] W. J. Parker, R. J. Jenkins, C. P. Butler and G. L. Abbott, *J. Appl. Phys.,* 32, 1679, (1961).
[9] G. J. Snyder and E. S. Toberer, *Nature Materials,* 7, 105, (2008).
[10] It was known but not well publicized that 3P—PbTe, which also contained Sn and Mn, had lower zT than 2P—PbTe but nevertheless was used because of better mechanical properties and ease of bonding[46].
[11] C. Wood, *Rep. Prog. Phys.,* 51, 459~539, (1988).
[12] G. J. Snyder, In *Thermoelectrics handbook: macro to nano*, Ed. by Rowe D M; CRC/Taylor & Francis: Boca Raton, 2006; p 91~926
[13] V. Fano, In *CRC Handbook of Thermoelectrics*, Ed. by Rowe D M; CRC Press: Boca Raton, Fla., 1995; pp 261
[14] C. B. Vining, In *CRC Handbook of Thermoelectrics*, Ed. by Rowe D M; CRC Press: Boca Raton, Fla., 1995; p 329~337
[15] A. V. Petrov, In *Thermoelectric Properties of Semiconductors*, Ed. by Kutasov V A; Consultants Bureau New York, 1964; p 17
[16] B. A. Efimova, L. A. Kolomoets, Y. I. Ravich and T. S. Stavitskaya, *Soviet Phys. Semiconductors,* 4, 1653, (1971).
[17] G. T. Alekseeva, V. K. Zaitsev, A. V. Petrov, V. I. Tarasov and M. I. Fedorov, *Sov. Phys. Solid State,* 23, 1685, (1981).
[18] E. D. Devyatkova and V. A. Saakyan, *Izv. Akad. Nauk Arm. SSR, Ser. Fiz. [in Russian],* 2, 14, (1967).
[19] G. T. Alekseeva, E. A. Gurieva, P. P. konstantinov and L. V. P. I. fedorov, *Semiconductors,* 30, 1125, (1996).
[20] L. E. Bell, *Science,* 321, 1457, (2008).
[21] A. F. Ioffe, *Semiconductor thermoelements, and Thermoelectric cooling*. Infosearch, ltd., London, 1957.
[22] M. G. Kanatzidis, *Chem. Mater.,* 22, 648, (2010).
[23] Y. Pei, J. Lensch-falk, E. S. Toberer, D. L. Medlin and G. J. Snyder, *Adv. Func. Mat., Accepted for publication,* (2010).
[24] K. F. Hsu, S. Loo, F. Guo, W. Chen, J. S. Dyck, C. Uher, T. Hogan, E. K. Polychroniadis and M. G. Kanatzidis, *Science,* 303, 818, (2004).
[25] J. P. Heremans, V. Jovovic, E. S. Toberer, A. Saramat, K. Kurosaki, A. Charoenphakdee, S. Yamanaka and G. J. Snyder, *Science,* 321, 554, (2008).
[26] K. Hoang, S. D. Mahanti and M. G. Kanatzidis, *Phys. Rev. B,* 81, 115106, (2010).
[27] D. Bile, S. D. Mahanti, E. Quarez, K. Hsu, R. Pcionek and M. G. 24 Kanatzidis, *Phys. Rev. Lett.,* 93, 146403, (2004).
[28] D. J. Singh, *Phys. Rev. B,* 81, 195217, (2010).
[29] S. V. Airapetyants, M. N. Vinogradova, I. N. Dubrovskaya, N. V. Kolomoets and I. M. Rudnik, *Soviet Phys. Solid State,* 8, 1069, (1966).
[30] I. A. Chernik, V. I. Kaidanov, M. I. Vinogradova and N. V. Kolomoets, *Soviet Phys. Solid State,* 2, 645, (1968).
[31] A. J. Crocker and L. M. Rogers, *Br. J. Appl. Phys.,* 18, 563, (1967).
[32] A. J. Crocker and L. M. Rogers, *J. De Physique, C*4, 129, (1968).
[33] S. Ahmad, S. D. Mahanti, K. Hoang and M. G. Kanatzidis, *Phys.* 36 *Rev. B,* 74, 155205, (2006).
[34] D. H. Parkinson and J. E. Quarrington, *Proc. Phys. Soc.,* LXVII, 41, (1954).
[35] L. M. Syoeva, M. N. Vinogradova, N. V. Kolomoets and Y. I. 40 Ravich, *Soviet Phys. Solid State,* 3, 975, (1970).
[36] R. S. Allgaier, *J. Appl. Phys.,* 32, 2185, (1961).
[37] R. S. Allgaier and B. B. Houston, *J. Appl. Phys.,* 37, 302, (1966).
[38] A. F. May, D. J. Singh and G. J. Snyder, *Phys. Rev. B,* 79, 153101, (2009).
[39] Y. W. Tsang and M. L. Cohen, *Phys. Rev. B,* 3, 1254-1261, (1971).
[40] E. H. Putley, *The Hall Effect and Related Phenomena*. Butterworths, London, 1960.
[41] A. A. Andreev and V. N. Radionov, *Soviet Phys. Semiconductors,* 1, 145, (1967).
[42] The constant Dulong-Petit heat capacity used for determining the thermal conductivity, is likely underestimated by about 10% at ~700 K[48]. Thus the actual thermal conductivity at high temperatures could be about 10% higher and zT 10% lower than the result shown here.

[43]C. M. Bhandari and D. M. Rowe. In *CRC Handbook of Thermoelectrics*, Ed. by Rowe D M; CRC Press: Boca Raton, Fla., 1995; p 45.

[44]S. Ahmad and S. D. Mahanti, *Phys. Rev. B,* 81, 165203, (2010).

[45]K. Ahn, C. Li, C. Uher and M. G. Kanatzidis, *Chem. Mater.,* 21, 1361, (2009).

[46]E. A. Skrabek and D. S. Trimmer, In *CRC Handbook of* 63 *Thermoelectrics*, Ed. by Rowe D M; CRC Press: Boca Raton, Fla., 1995; p 272

[47]I. Kudman, *Metall. Trans.,* 2 163 (1971).

[48]M. Zhou, J. Li and T. Kita, *J. Am. Chem. Soc,* 130, 4527, (2008).

What is claimed is:

1. A composition comprising PbTe(Se):Na, wherein 0 Mol %<Na≤2 mol % and 0 mol %<Se≤50 mol %; and wherein the composition is (i)>98% theoretical density and (ii) single phased.

2. The composition of claim 1, wherein the composition has a maximum thermoelectric figure of merit (zT)≥1.5 at 850 K.

3. A composition comprising Pb(Mg)Te:Na; wherein the composition is (i)≥98% theoretical density and (ii) single phased.

4. The composition of claim 3, wherein the composition has a maximum thermoelectric figure of merit (zT)≥1.5 at 850 K.

* * * * *